United States Patent
Zhang et al.

(10) Patent No.: US 8,532,962 B2
(45) Date of Patent: Sep. 10, 2013

(54) APPROACH FOR PLANNING, DESIGNING AND OBSERVING BUILDING SYSTEMS

(75) Inventors: Yajun-Edwin Zhang, Shanghai (CN); Zhao Xia Jin, Shanghai (CN); Jerry Qi Huang, Markham (CA); Andrew D. Halford, Manchester, MD (US); Chengyi Liu, Shanghai (CN); Curtis Mitchell, Newmarket (CA)

(73) Assignee: Honeywell International Inc., Morristown, NJ (US)

( * ) Notice: Subject to any disclaimer, the term of this patent is extended or adjusted under 35 U.S.C. 154(b) by 651 days.

(21) Appl. No.: 12/646,416

(22) Filed: Dec. 23, 2009

(65) Prior Publication Data

US 2011/0153279 A1    Jun. 23, 2011

(51) Int. Cl.
*G06F 17/50* (2006.01)
*G09B 25/00* (2006.01)

(52) U.S. Cl.
USPC .................................. 703/1; 434/72; 434/79

(58) Field of Classification Search
USPC .......................................... 703/1; 434/72, 79
See application file for complete search history.

(56) References Cited

U.S. PATENT DOCUMENTS

| | | |
|---|---|---|
| 5,719,561 A | 2/1998 | Gonzales |
| 5,745,126 A | 4/1998 | Jain et al. |
| 5,857,986 A | 1/1999 | Moriyasu |
| 6,006,161 A | 12/1999 | Katou |
| 6,334,211 B1 | 12/2001 | Kojima et al. |
| 6,710,706 B1 | 3/2004 | Withington et al. |
| 6,720,921 B2 | 4/2004 | Ripingill, Jr. et al. |
| 6,876,951 B2 | 4/2005 | Skidmore et al. |
| 6,900,762 B2 | 5/2005 | Andrews et al. |
| 6,924,787 B2 | 8/2005 | Kramer et al. |
| 6,965,312 B2 | 11/2005 | Lerg |
| 7,002,551 B2 | 2/2006 | Azuma et al. |

(Continued)

FOREIGN PATENT DOCUMENTS

| | | |
|---|---|---|
| GB | 2441434 | 5/2008 |
| JP | 11024735 | 1/1999 |

(Continued)

OTHER PUBLICATIONS

Sacks, Rafael et al., "A Project Model for an Automated Building System: Design and Planning Phases", 1997, Automation in Construction 7, Elsevier Science B.V.*

(Continued)

*Primary Examiner* — Kamini S Shah
*Assistant Examiner* — Cedric D Johnson
(74) *Attorney, Agent, or Firm* — Seager Tufte & Wickhem LLC.

(57) ABSTRACT

A system which may enable users to plan, design and observe various building systems in an abstract and intuitive view, such as with a map view. In this view, virtually all facility information and objects may be displayed as simple shapes (e.g., rectangles). Just by some drag-and-drop, a user may provide shapes and rearrange positions of these shapes quickly to reflect a desired space relationship. Objects (e.g., components, devices, controllers, and the like) may be placed, moved around, and associated with each other on a facility layer or floor. Further, the map view may be used together with a tree view and a list view to provide alternative design ways. Changes made in any of the views may be synchronized with the other views. Various presentations of the facility may be provided.

21 Claims, 24 Drawing Sheets

(56) References Cited

U.S. PATENT DOCUMENTS

| | | |
|---|---|---|
| 7,062,722 B1 | 6/2006 | Carlin et al. |
| 7,096,120 B2 | 8/2006 | Hull |
| 7,102,510 B2 | 9/2006 | Boling et al. |
| 7,111,783 B2 | 9/2006 | Xi et al. |
| 7,132,928 B2 | 11/2006 | Perricone |
| 7,139,685 B2 | 11/2006 | Bascle et al. |
| 7,146,218 B2 | 12/2006 | Esteller et al. |
| 7,164,972 B2 | 1/2007 | Imhof et al. |
| 7,200,639 B1 | 4/2007 | Yoshida |
| 7,246,008 B2 | 7/2007 | Daubert et al. |
| 7,246,044 B2 * | 7/2007 | Imamura et al. ............... 703/1 |
| 7,292,908 B2 | 11/2007 | Borne et al. |
| 7,301,648 B2 | 11/2007 | Foxlin |
| 7,304,442 B2 | 12/2007 | Colwell |
| 7,308,323 B2 | 12/2007 | Kruk et al. |
| 7,342,648 B2 | 3/2008 | Solomon et al. |
| 7,358,458 B2 | 4/2008 | Daniel |
| 7,382,281 B2 | 6/2008 | Kavaler |
| 7,383,148 B2 | 6/2008 | Ahmed |
| 7,389,207 B2 | 6/2008 | Saitta |
| 7,420,510 B2 | 9/2008 | Kolavennu et al. |
| 7,496,445 B2 | 2/2009 | Mohsini et al. |
| 7,512,450 B2 | 3/2009 | Ahmed |
| 7,545,263 B2 | 6/2009 | Plocher et al. |
| 7,548,833 B2 | 6/2009 | Ahmed |
| 7,567,844 B2 | 7/2009 | Thomas et al. |
| 7,583,275 B2 | 9/2009 | Neumann et al. |
| 7,596,473 B2 | 9/2009 | Hansen et al. |
| 7,606,579 B2 | 10/2009 | Thacher |
| 7,610,910 B2 | 11/2009 | Ahmed |
| 7,612,832 B2 | 11/2009 | Zhang et al. |
| 7,664,574 B2 | 2/2010 | Imhof et al. |
| 7,683,793 B2 | 3/2010 | Li et al. |
| 7,715,980 B2 | 5/2010 | Bargeron et al. |
| 7,733,836 B2 | 6/2010 | Huseth |
| 7,764,220 B1 | 7/2010 | Samaniego |
| 7,774,075 B2 | 8/2010 | Lin |
| 7,777,666 B2 | 8/2010 | Gregory et al. |
| 7,830,250 B2 | 11/2010 | Huseth et al. |
| 7,898,468 B2 | 3/2011 | Samaniego et al. |
| 7,962,150 B2 | 6/2011 | Hertzog et al. |
| 7,973,669 B2 | 7/2011 | Pham et al. |
| 7,982,614 B2 | 7/2011 | Holm et al. |
| 8,000,892 B2 | 8/2011 | Banerjee |
| 8,040,273 B2 | 10/2011 | Tomich et al. |
| 8,041,744 B2 | 10/2011 | Heikkonen et al. |
| 8,089,407 B2 | 1/2012 | Chen et al. |
| 8,102,423 B2 | 1/2012 | Cheng |
| 8,279,119 B2 | 10/2012 | Elwell, Jr. et al. |
| 8,289,390 B2 | 10/2012 | Aggarwal et al. |
| 8,306,748 B2 | 11/2012 | Huseth et al. |
| 2002/0055384 A1 | 5/2002 | Armstrong |
| 2003/0083957 A1 | 5/2003 | Olefson |
| 2003/0214400 A1 | 11/2003 | Mizutani et al. |
| 2004/0021569 A1 | 2/2004 | Lepkofker et al. |
| 2004/0233192 A1 | 11/2004 | Hopper |
| 2005/0010460 A1 | 1/2005 | Mizoguchi et al. |
| 2005/0264558 A1 | 12/2005 | Vesely et al. |
| 2005/0267900 A1 | 12/2005 | Ahmed et al. |
| 2006/0009862 A1 | 1/2006 | Imhof et al. |
| 2006/0029256 A1 | 2/2006 | Miyoshi et al. |
| 2006/0044307 A1 | 3/2006 | Song |
| 2006/0061752 A1 | 3/2006 | Solomon et al. |
| 2006/0073455 A1 | 4/2006 | Buyl et al. |
| 2006/0265664 A1* | 11/2006 | Simons et al. ............... 715/772 |
| 2006/0282235 A1* | 12/2006 | Thomas et al. ............... 703/1 |
| 2007/0001904 A1 | 1/2007 | Mendelson |
| 2007/0201421 A1 | 8/2007 | Huseth |
| 2007/0205886 A1 | 9/2007 | Huseth et al. |
| 2007/0239350 A1 | 10/2007 | Zumsteg et al. |
| 2007/0239352 A1 | 10/2007 | Thota et al. |
| 2007/0250199 A1* | 10/2007 | Akasaka et al. ............... 700/97 |
| 2007/0279210 A1 | 12/2007 | Li et al. |
| 2008/0033645 A1 | 2/2008 | Levinson et al. |
| 2008/0040669 A1 | 2/2008 | Plocher et al. |
| 2008/0062167 A1 | 3/2008 | Boggs et al. |
| 2008/0068267 A1 | 3/2008 | Huseth et al. |
| 2008/0077326 A1 | 3/2008 | Funk et al. |
| 2008/0122696 A1 | 5/2008 | Huseth et al. |
| 2008/0158256 A1 | 7/2008 | Rusell et al. |
| 2008/0215524 A1 | 9/2008 | Fuchs et al. |
| 2008/0220780 A1 | 9/2008 | Huseth et al. |
| 2008/0228039 A1 | 9/2008 | Huseth et al. |
| 2009/0040175 A1 | 2/2009 | Xu et al. |
| 2009/0043504 A1 | 2/2009 | Bandyopadhyay et al. |
| 2009/0044808 A1 | 2/2009 | Guney et al. |
| 2009/0046140 A1 | 2/2009 | Lashmet et al. |
| 2009/0105006 A1 | 4/2009 | Doyle |
| 2009/0216438 A1 | 8/2009 | Shafer |
| 2009/0216775 A1 | 8/2009 | Ratliff et al. |
| 2009/0265104 A1 | 10/2009 | Shroff |
| 2009/0298024 A1 | 12/2009 | Batzler et al. |
| 2009/0307255 A1* | 12/2009 | Park ............... 707/102 |
| 2010/0057354 A1 | 3/2010 | Chen et al. |
| 2010/0121567 A1 | 5/2010 | Mendelson |
| 2010/0299065 A1 | 11/2010 | Mays |
| 2011/0010134 A1* | 1/2011 | Balla et al. ............... 703/1 |
| 2011/0059698 A1 | 3/2011 | Huseth et al. |
| 2011/0082643 A1 | 4/2011 | Huseth et al. |
| 2011/0112875 A1 | 5/2011 | Johnson et al. |
| 2011/0137549 A1 | 6/2011 | Gupta et al. |
| 2011/0164768 A1 | 7/2011 | Huseth et al. |
| 2011/0248847 A1 | 10/2011 | Huseth et al. |
| 2011/0268300 A1 | 11/2011 | DeMers et al. |
| 2011/0270584 A1 | 11/2011 | Plocher et al. |
| 2011/0270654 A1 | 11/2011 | Banerjee et al. |
| 2011/0276264 A1 | 11/2011 | Plocher et al. |
| 2011/0285851 A1 | 11/2011 | Plocher et al. |
| 2012/0130632 A1 | 5/2012 | Bandyopadhyay et al. |
| 2012/0143495 A1 | 6/2012 | Dantu |
| 2012/0169530 A1 | 7/2012 | Padmanabhan |
| 2012/0173204 A1 | 7/2012 | Padmanabhan |
| 2012/0194517 A1 | 8/2012 | Izadi et al. |
| 2012/0319903 A1 | 12/2012 | Huseth et al. |

FOREIGN PATENT DOCUMENTS

| | | |
|---|---|---|
| JP | 11317936 | 11/1999 |
| JP | 2001356813 | 12/2001 |
| JP | 2005242531 | 9/2005 |
| JP | 2005311563 | 11/2005 |
| JP | 2007183432 | 7/2007 |
| JP | 2007333998 | 12/2007 |
| WO | WO 92/10953 | 7/1992 |
| WO | 2005033912 | 4/2005 |
| WO | WO 2005033912 A2 * | 4/2005 |
| WO | WO 2005/040989 | 5/2005 |
| WO | WO 2009/029834 | 3/2009 |
| WO | WO 2009/071919 | 6/2009 |
| WO | WO 2010/107379 | 9/2010 |

OTHER PUBLICATIONS

Rashidi, Parisa, "Smart Home Adaptation Based on Explicit and Implicit User Feedback", Dec. 2007, Electrical Engineering and Computer Science Department, Washington State University.*

Honeywell, "Excel Building Supervisor-Integrated R7044 and FS90 Ver. 2.0," Operator Manual, 70 pages, Apr. 1995.

Trane, "System Programming, Tracer Summit Version 14, BMTW-SVP01D-EN," 623 pages, 2002.

Davies et al., "Scalable, Distributed, Real-Time Map Generation", IEEE, Intelligent Transport Systems, p. 47-54, 2006.

Engineering Acoustics, Inc., "Tactor Interface/Controller Advanced Evaluation Board Eval. 2.0", 2 pages, prior to Apr. 30, 2010.

http://www.sara.com/ISR/low—frequencyEM/magneticcommunication.html, "Magnetic Communications", 2 pages, Jun. 27, 2011.

Matsumoto, "Real-Time Multi-Sensor Localisation and Mapping Algorithms for Mobile Robots", 309 pages, 2009.

Walker et al., "Development and Evaluation of a System for Wearable Audio Navigation", Proceedings of the Human Factors and Ergonomics Society 49th Annual Meeting, p. 1607-1609, 2005.

Yagi et al., "Real-Time Generation of Environmental Map and Obstacle Avoidance Using Omnidirectional Image Sensor with Conic Mirror", IEEE, p. 160-165, 1991.

"Incident Management IPT Requirements BAA for Topics Related to Geospatial Location Accountability and Navigation System for Emergency Responders (GLANSER)," Broad Agency Annoucement BAA09-02, pp. 1-34, Jan. 23, 2009.

Baronski, "New Sensor Signal Processor Paradigms: When One Pass Isn't Enough," HPEC, 19 pages, 2008.

Budroni et al., "Automated 3D Reconstruction of Interiors from Point Clouds," International Journal of Architechtural Computing, vol. 8, Issue 1, pp. 55-74, Mar. 2010.

Cinaz et al., "HeadSLAM—Simultaneous Localization and Mapping with Head-Mounted Inertial and Laser Range Sensors," IEEE pp. 3-10, 2008.

U.S. Appl. No. 13/538,677, filed Jun. 29, 2012.

Davison, "Real-Time Simultaneous Localisation and Mapping with a Single Camera," Proceedings of the Ninth IEEE International Conference on Computer Vision, pp. 1-8, 2003.

Fischer et al., "Location and Navigation Support for Emergency Responders: A Survey," IEEE CS, pp. 38-47, 2010.

Honeywell, "Precision Indoor Personnel Location and Tracking for Emergency Responders," 20 pages, Aug. 3-4, 2009.

http://www.firerescuel.com/print.asp?act=print&vid=405845, "3-D Locator Featured at Washington Tech. Demonstration," 3 pages, Jun. 20, 2008.

Johnston et al., "Estimating Building Floor-Plans From Exterior Using Laser Scanners," SPIE IS&T vol. 6805, 11 pages, 2008.

Kumar et al., "Robot and Sensor Networks for First Responders," IEEE CS and IEEE ComSoc, pp. 24-33, Oct.-Dec. 2004.

Le et al., "Ultrawideband (UWB) Radar Imaging of Building Interior: Measurements and Predictions," IEEE Transactions on Geoscience and Remote Sensing, vol. 47, No. 5, pp. 1409-1420, May 2009.

Rau et al., "Geometrical Building Modeling and Its Application to the Ortho-Rectification for Aerial Images," Journal of Photogrammetry and Remote Sensing, vol. 9, No. 1, pp. 53-76, Mar. 2004.

Snavely et al., "Modeling the World from Internet Photo Collections," International Journal of Computer Vision, vol. 80, Issue 2, pp. 189-210, 2008.

Wang et al., "Camera Localization and Building Reconstruction from Single Monocular Images," 8 pages, 2008.

www.automatedbuildings.com/news/may10/articles/lavelleenergy/100427104606 1avelle.htm, "Virtual Building Energy Management Moving to Cloud-based Building Energy Management," 7 pages, May 2010.

Henke, "The Table Metaphor: A Representation of a Class and Its Instances," 6 pages, 2005.

http://kpogre.sourceforge.net/tutorial03/index.html, "Tutorial 3—Create Table Using Wizard," 8 pages, published Feb. 8, 2007.

http://uic.edu/depts/accc/seminars/access2000-intro/tables.html, "Creating Tables with the Table Wizard—Access 2000 Introduction," 3 pages, published Jan. 24, 2001.

* cited by examiner

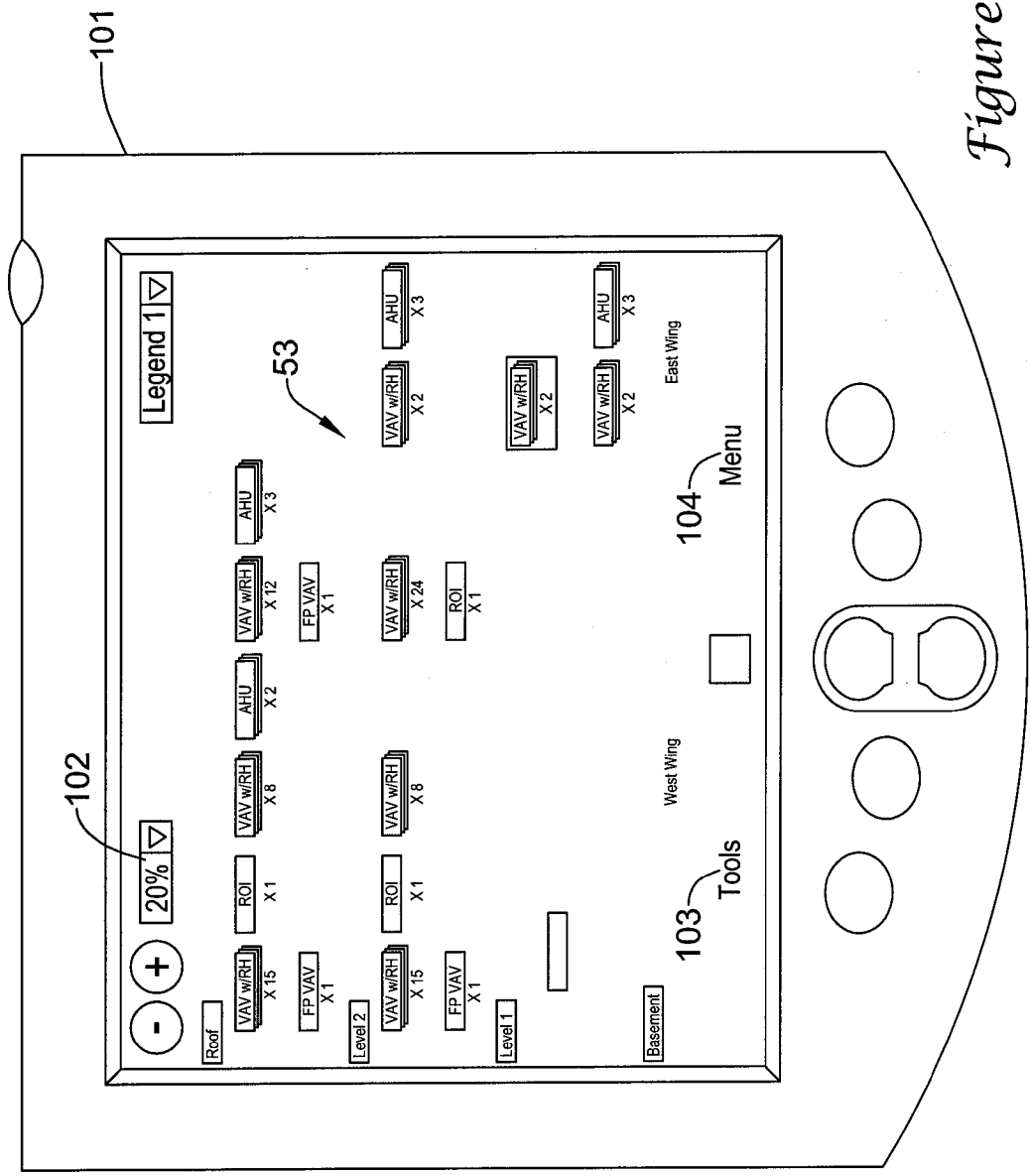

APPROACH FOR PLANNING, DESIGNING AND OBSERVING BUILDING SYSTEMS

BACKGROUND

The invention pertains to building systems and particularly to planning, designing and observing building systems. More particularly, the invention pertains to tools for planning, designing and observing building systems.

SUMMARY

The invention is an approach which may enable users to plan, design and observe various building systems in an abstract and intuitive view, such as with a map view. In this view, virtually all facility information and objects may be displayed as simple shapes (e.g., rectangles). Just by some drag-and-drop, a user may provide shapes and rearrange positions of these shapes quickly to reflect a desired space relationship. Objects (e.g., components, devices, controllers, and the like) may be placed, moved around, copied and duplicated, and associated with each other on a facility layer or floor. Further, the map view may be used together with a tree view and a list view to provide alternative design ways. Changes made in any of the views may be synchronized with the other views. Various presentations of the facility may be provided.

BRIEF DESCRIPTION OF THE DRAWING

FIGS. 23*a* and 23*b* are diagrams of a small screen or hand-held device, such as an illustrative example of a personal digital assistant (PDA), showing several kinds of map views of a building structure.

DESCRIPTION

Figure 1:
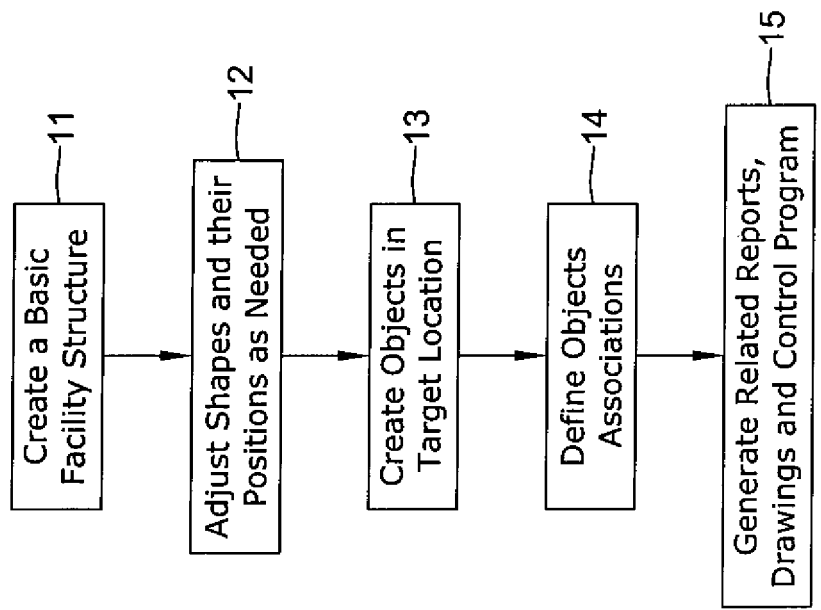
FIG. 1 is a basic flow diagram of blocks for a plan and design of an example structure.

There are many tools designed to help users to plan and design various building systems, e.g., HVAC control solutions, fire detection and alarm systems, and so forth.

Generally, two types of metaphor are provided among existing tools. One type of metaphor is to let users work with a tree structure. A large problem for users working with a tree structure is that the tree structure cannot indicate to users the space relationship of locations or objects. For example, when there are two tree nodes, a location A and a location B; users still do not necessarily know whether location A and location B are close to each other or far away. The same situation applies to a controller A and a controller B. Yet, this information is very critical to plan and design work. For example, without knowing a space relationship of the devices, users cannot know how the devices are distributed in the facility. Therefore, users cannot know how to distribute controllers and network, which devices are controlled by which controller, and so forth. Usually, users will refer to CAD drawings to get the space relationship, but this kind of cross reference may make the work inefficient, and CAD drawings may actually be an over-kill for this task. In addition, the tree structure can be a very abstract view. This view does not necessarily provide users an intuitive way to plan and design various building systems efficiently and easily.

Another type of metaphor needs users to work on CAD drawings in the CAD tools. For example, there may be ways that relate to a tool to help a user design various building systems, e.g., fire detection and alarm system. However, there may be several issues for users to work relative to CAD tools (e.g., AutoCAD tool) and CAD drawings in the plan and design of various building systems. First, Users must be familiar with CAD tools, which may be burdensome to them. Some users may not be able to use CAD tools. Second, CAD tools might be an overkill for satisfying users' needs in planning and designing an HVAC control solution, since there may be many unnecessary features which can lead to system performance issues. Third, sometimes, the CAD drawings for a certain project may not necessarily be available, e.g., for a legacy project, often one cannot conveniently get just any CAD drawing. Users may need to go to the site to understand the facility model. Fourth, working on CAD drawings is not necessarily a good idea because of their high level of detail. Usually a facility site may have multiple CAD drawings, e.g., one drawing for each floor. In these cases, working on CAD drawings does not necessarily provide a user the big picture. For example, when users need to deal with a cross floor situation, they may need to switch between different drawings back and forth which can be time consuming and inefficient. Also, integrating with CAD tools may indicate a need to purchase a CAD tool which will increase the cost of a system design. Additionally, CAD drawings might be too complex to be displayed in the small screen devices.

In view of the issues listed herein, there appears to be a need to provide a graphical and intuitive metaphor for users to plan and design various building systems more efficiently with a big picture understanding having both a logical relationship and a spatial relationship.

The present approach may enable users to plan and design various building systems in an abstract and intuitive view, such as with a map view. In this view, virtually all facility information is displayed as simple shapes (e.g., rectangles). Just by some drag-and-drop, a user may rearrange the positions of these shapes quickly to reflect their space relationship. Objects (i.e., devices and controllers) may be placed, moved around, and associated with each other on a facility layer. Through this way, users may plan and design a building system graphically and intuitively, meanwhile, they can avoid the overwhelming information of other approaches such as those involving CAD tools.

Several approaches, for example, the table metaphor and wizard, may be provided for users to create shapes quickly and easily to reflect a facility model. Other features may also be provided in this view to help users plan and design various building systems efficiently and easily, e.g., grouping similar objects to avoid visual clutter, contextual capacity information, to help the users assign objects to controllers, and so forth.

Further, the present map view may be used together with a tree view and a list view to provide different alternative design ways for users. Changes made in any of the views may be synchronized with other views.

The map view may also be used in some small screen, mobile, permanently situated, or hand-held devices, such as for example a PDA. It may be easier for users to work with the map view in the small screen, mobile, permanently situated, or hand-held devices, rather than with a tree structure on a large display or CAD drawings.

FIG. 1 is a basic flow diagram of blocks in an order of 11 through 15 for a plan and design of a structure. In block 11, a basic facility structure may be created. After block 11, shapes and their positions in the facility may be adjusted as needed, as indicated in block 12. In block 13, objects in a target location may be created. Associations of the objects may be defined according to block 14. Related reports, drawings and a control program may be generated at block 15. Blocks 11 and 12 may concern creating a facility model. Blocks 13, 14 and 15 may concern designing a control system.

Figure 2:
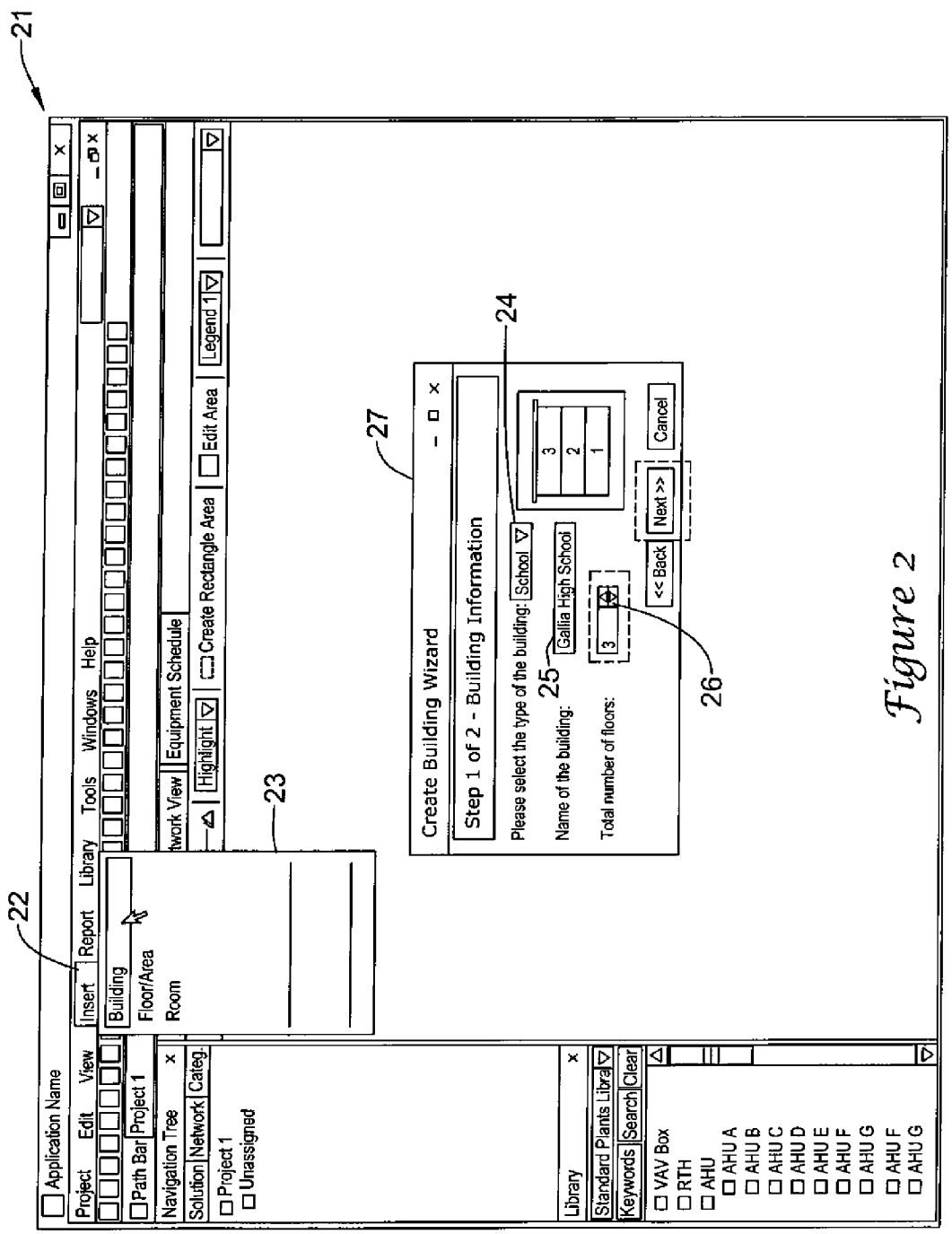
FIG. 2 is a diagram of a dialog box showing building information.
Figure 3:
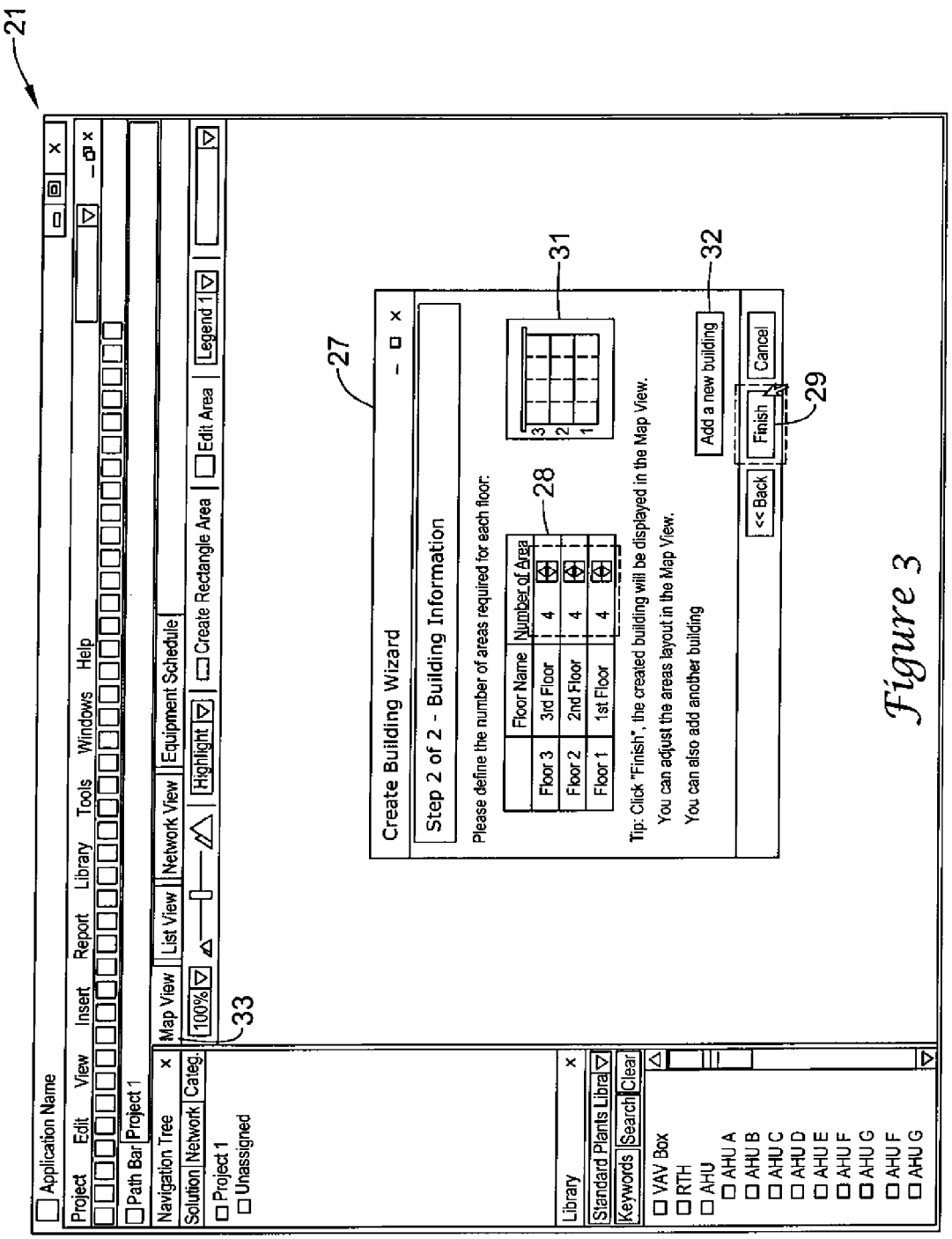
FIG. 3 is a diagram of the dialog box showing more building information.
Figure 4:
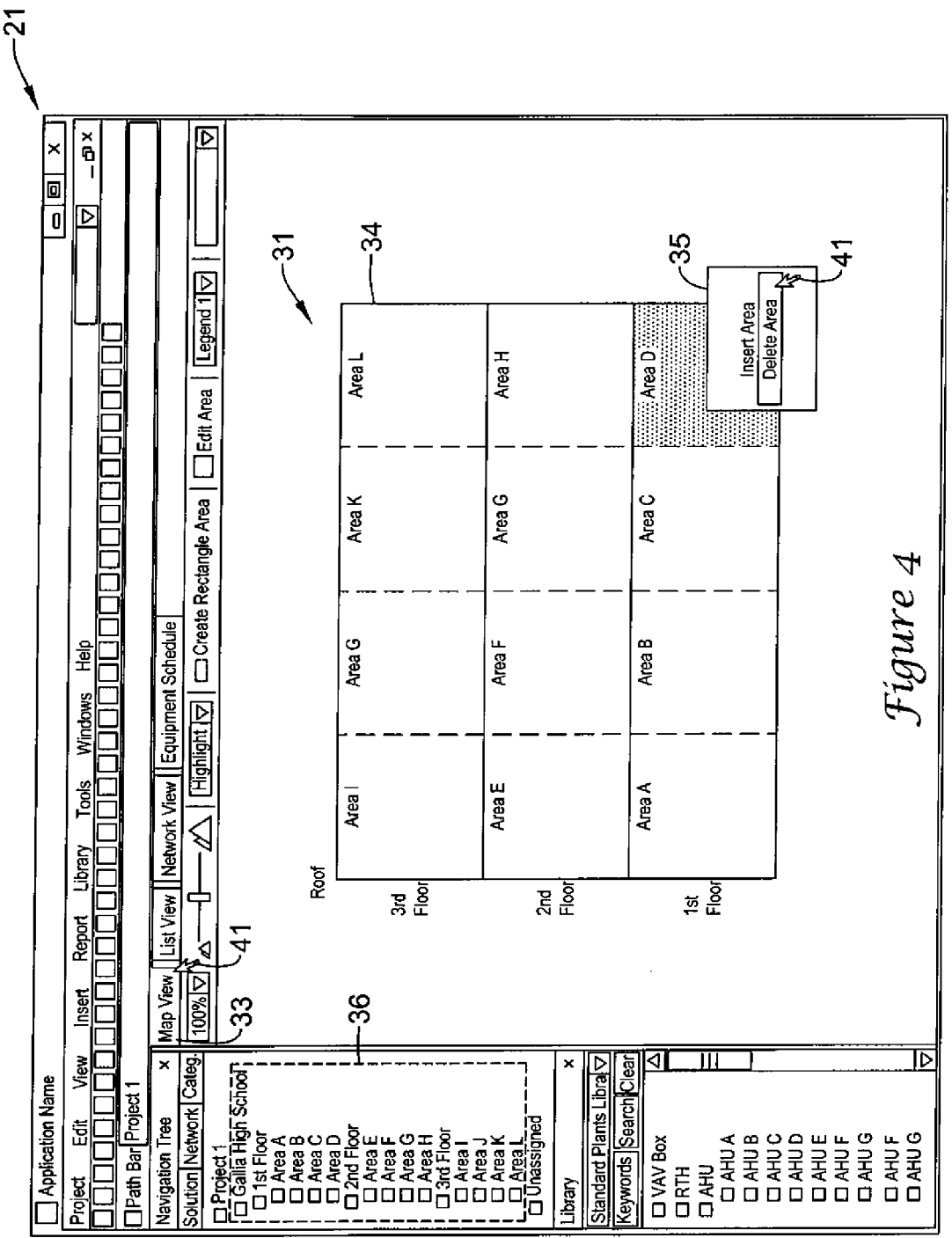
FIG. 4 is a diagram of tree-map like facility model showing several floors and their respective areas.

FIGS. 2-4 show screens involving the use of wizard, one approach noted herein. FIG. 2 shows a display or screen 21. A user may click on "Insert" 22 and select "Building" from a drop down menu 23. The user may command to create a building using the main menu in screen 21, as shown. The user may then define building information, for example, a building type and name, and a number of floors, at spaces 24, 25 and 26, respectively, of dialog box 27. Dialog box 27 of FIG. 2 shows step one of building information. Step two of building information may be shown by dialog box 27 in FIG. 3. The number of areas required for each floor may be selected at space 28. Each floor may be given a name in space 28. After completing all the entries required or desired in box 27 of screen 21 in FIG. 3, the user may click a "Finish" button 29 to display a created model building 34 in a small map view 31 in screen or display 21 of FIG. 4. The user may adjust the area layout in map view 31. Another building may be added by starting with a select click of a mouse cursor or arrow 41 on a button 32 in box 27 of screen 21 in FIG. 3.

To get a large map view 31 of a facility model, the user may select or click a button 33 entitled "Map View", with the mouse cursor 41 in screen 21 of FIG. 4. View 31 in this Figure may reveal the tree-map like facility model 34 showing first through third floors with areas A through L. A user may modify facility model 34. For example, the user may merge or split some areas, or delete or insert areas as shown by a mouse arrow 41 on block 35. A palette 36 shows a list revealing a tree of the project, the building name, e.g., "Gallia High School", and the floors and the areas on each of the floors.

Figure 5:
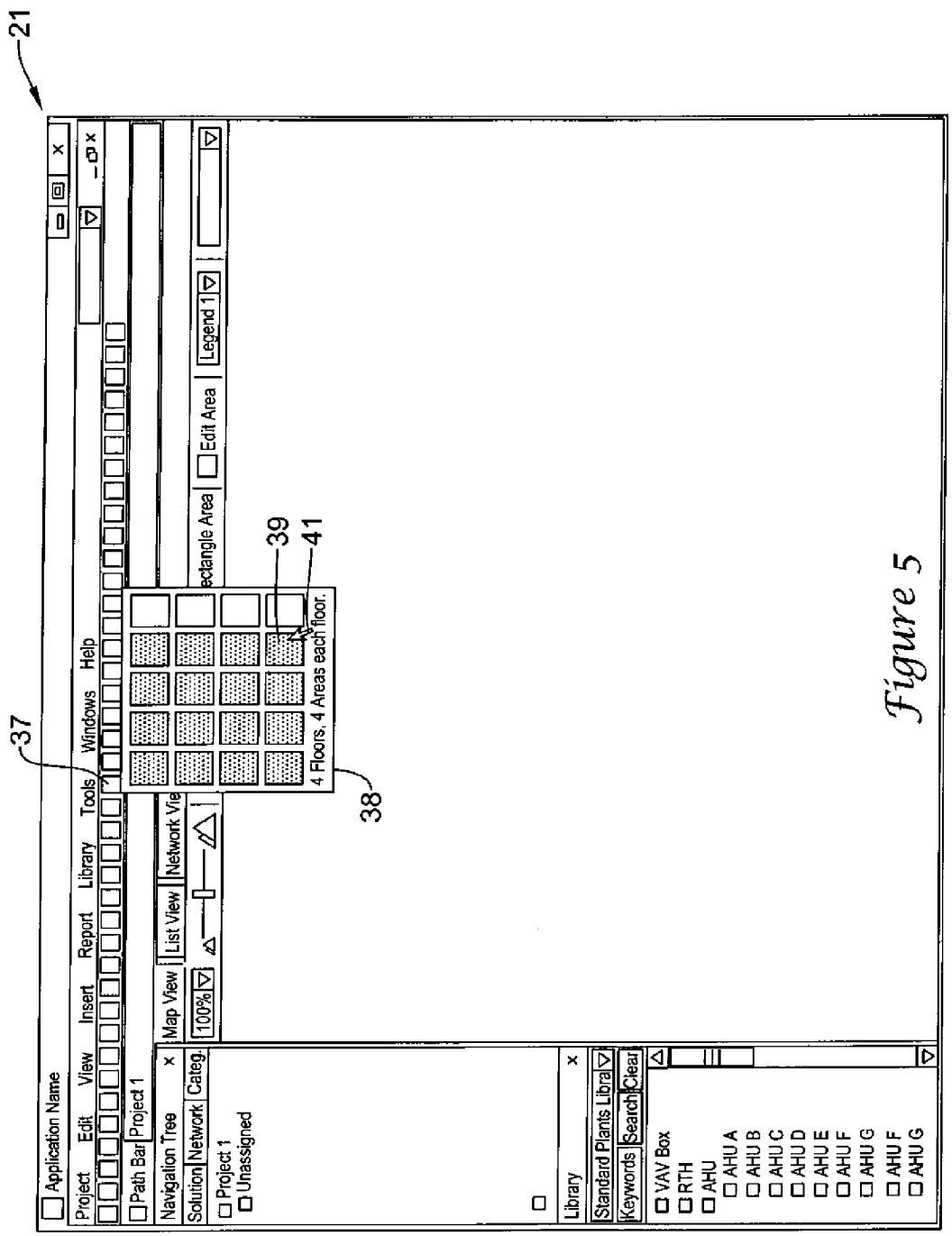
FIG. 5 is a diagram of a screen containing an insert of a table metaphor for creating a building with a capability for dragging a cell down or to the right to define a number of floors and areas, respectively.
Figure 6:
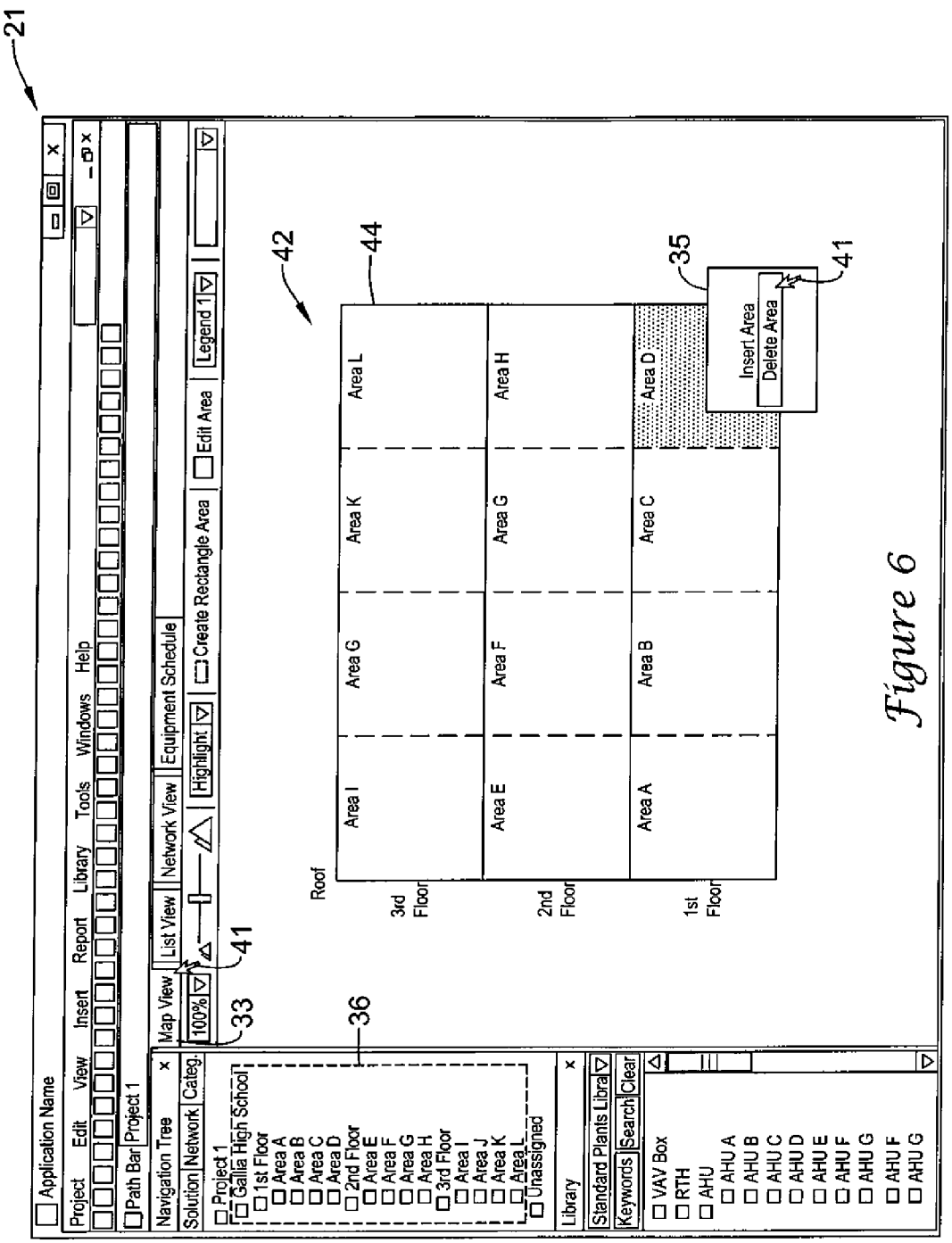
FIG. 6 is a diagram showing a view of a facility model which may be modified.

FIG. 5 shows screen 21 revealing a use of the table metaphor, a second approach for planning and designing a structure. By clicking on button 37, the user may obtain an insert table metaphor 38 and create a building by dragging a cell 39 down or to the right to define a number of floors and areas, respectively. FIG. 6 shows a result which is a view 42 of a facility model 44 which may resemble model 34 in FIG. 4. Model 44 is a tree-like map which may be modified by merging or splitting some areas, or deleting or inserting areas as shown by mouse arrow 41 on block 35. A tree of the facility model 44 is shown in palette 36 of screen 21 in FIG. 6.

Figure 7:
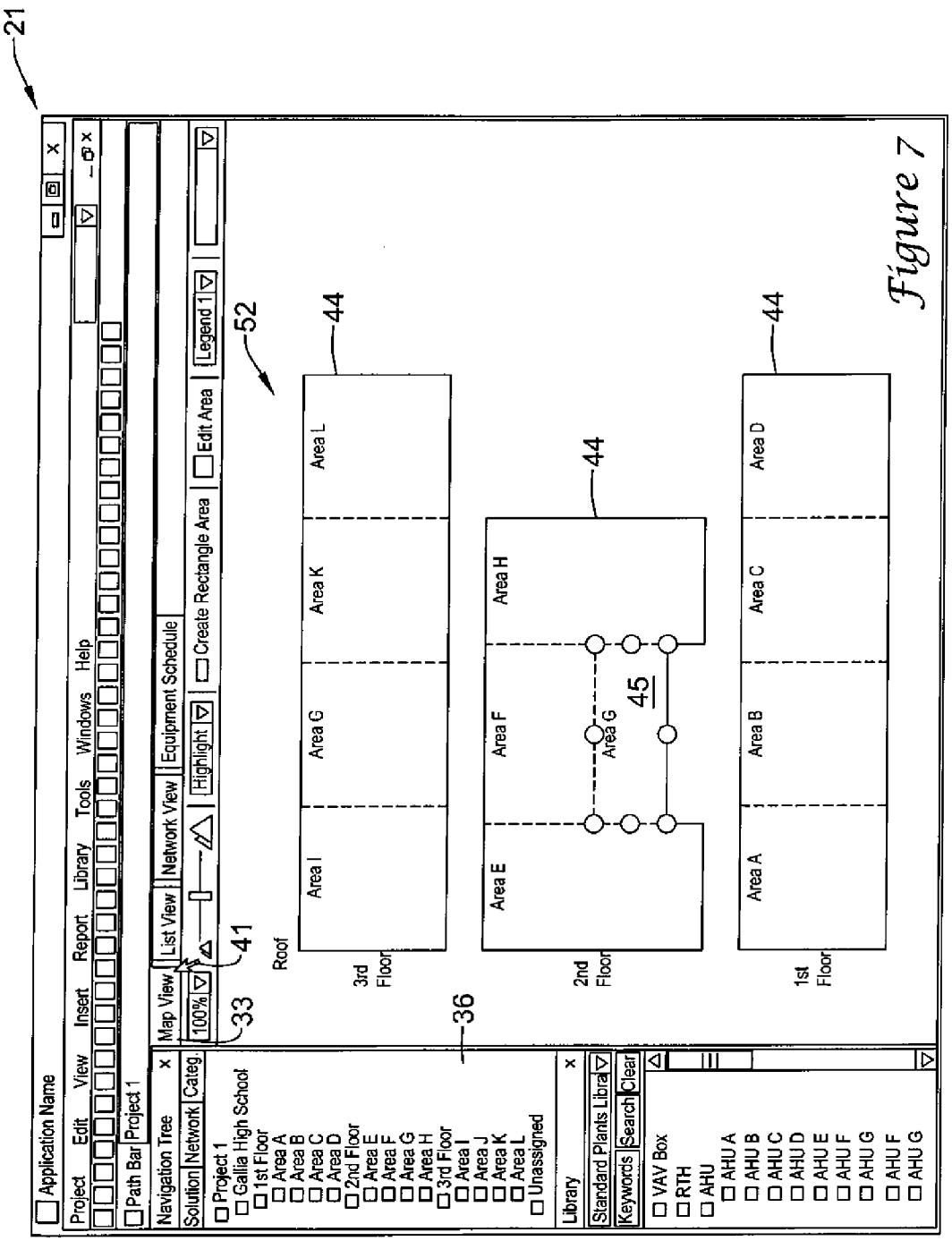
FIG. 7 is a diagram showing a plan view of the floors of the facility model where the shape, size and location of an area may be graphically changed.

FIG. 7 indicates that the user may adjust the shape of each area and their locations to reflect their real space relationship, via a graphic editing technique. FIG. 7 shows a plan view 52 of the floors of the facility model 44. For example, a user may move and resize an area 45, change the shape of the area by editing its vertex, moving one of the vertexes, and so on. The area 45 may be listed as area G on the second floor. As the shape, size and location of area 45 is changed, the adjacent areas E, F and H become adjusted to maintain common walls relative to area 45.

Figure 8:
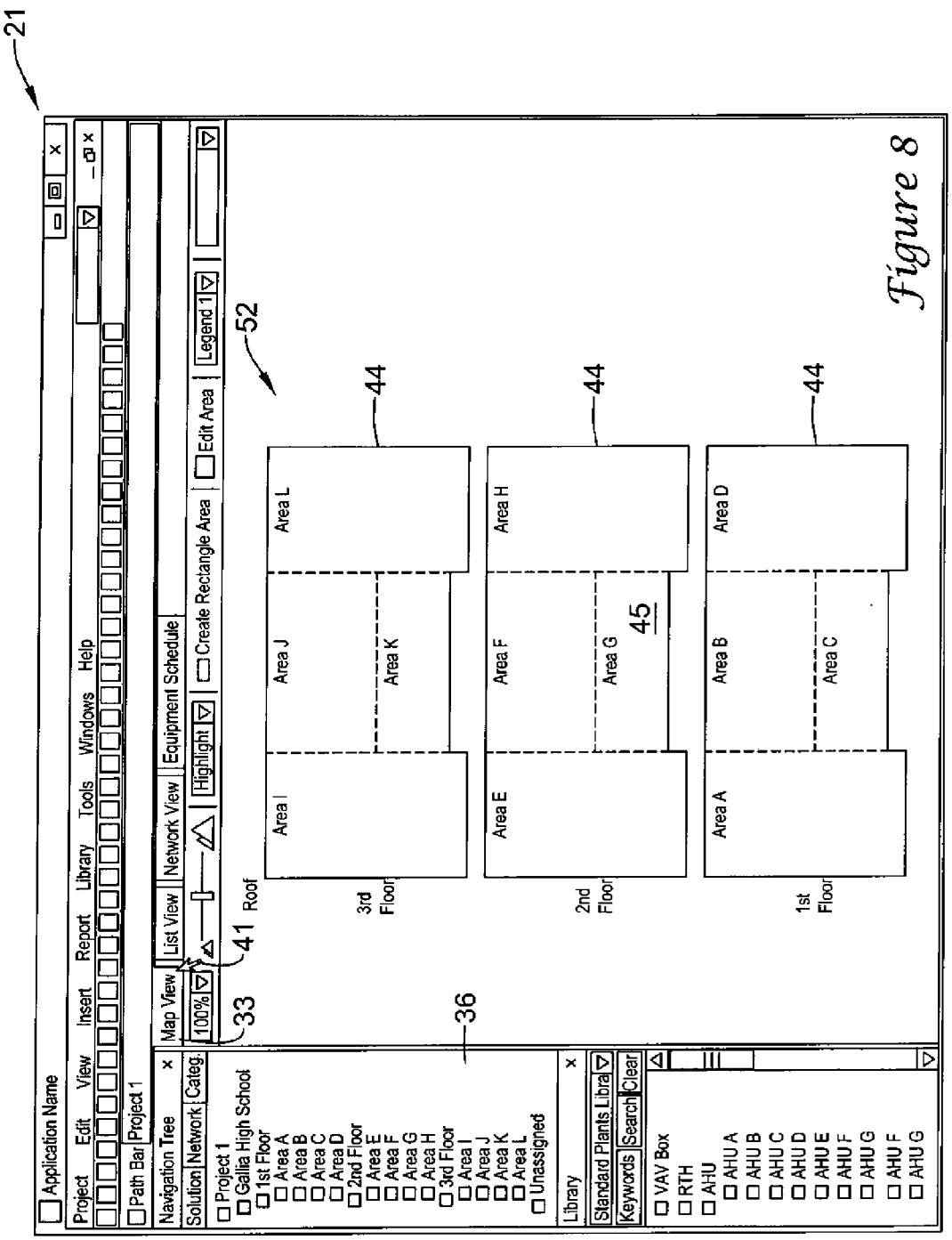
FIG. 8 is a diagram showing how the tree-map view is adjusted to reflect a real space relationship among the areas of various floors.

FIG. 8 shows the other first and third floors becoming adjusted to reflect the same floor plan of the vertically corresponding areas, so that the floors of the same building may be congruent relative to each other. The tree-map like view may be adjusted to reflect a real space relationship of the floors and areas.

Figure 9:
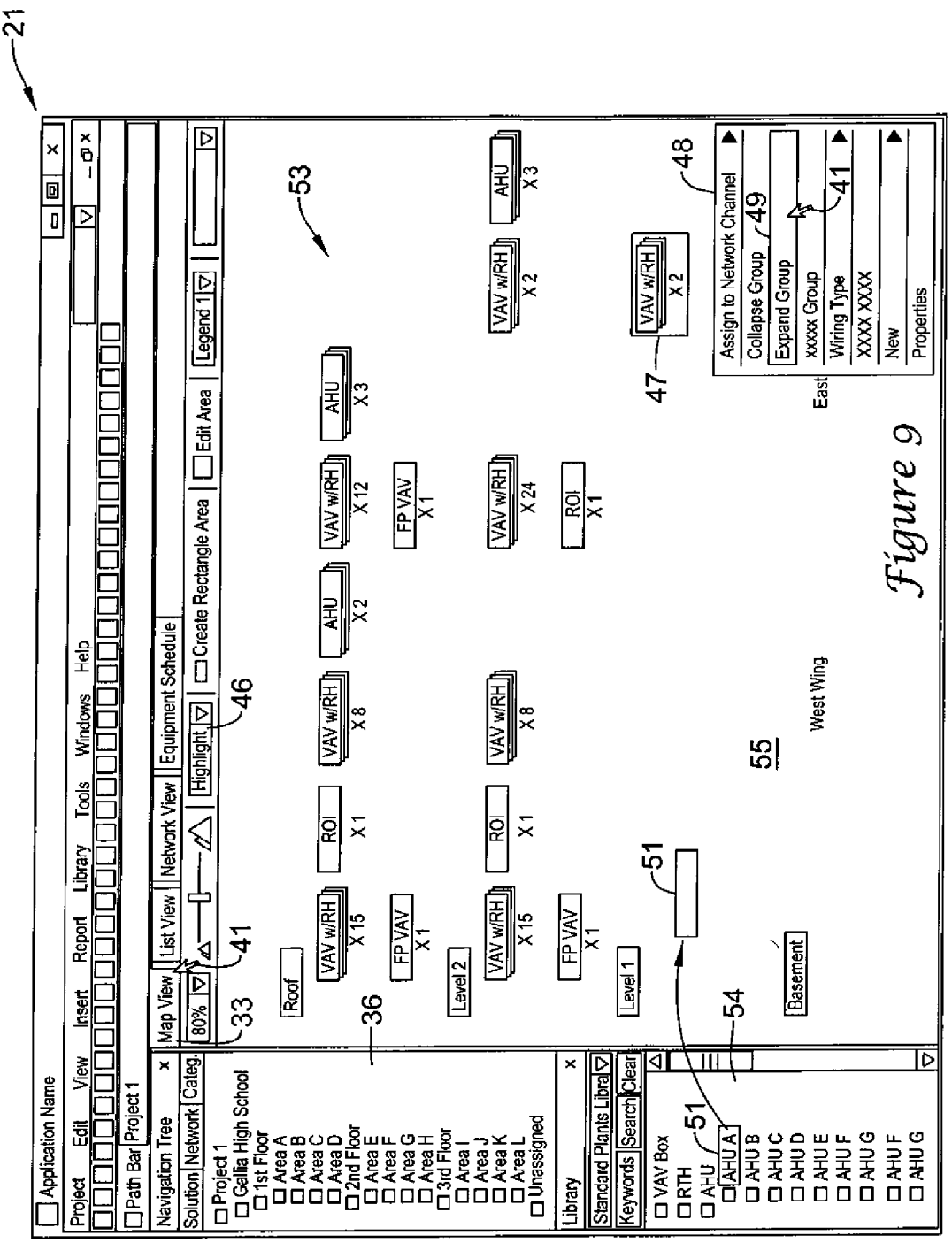
FIG. 9 is a diagram showing a screen on which objects can be displayed in various ways in a map view by clicking on a button that can, for instance, highlight or non-highlight, or show or hide, select or deselect a type of object in the map view to reveal various features of the object so as to help one to use a map view easily, and the objects may be displayed as labels and the same type of objects can be grouped together as a stack.

FIG. 9 is a diagram showing a screen 21 on which objects can be displayed in various ways in a map view by clicking on a button that can, for instance, highlight, show or hide, or select or deselect a type of object in the map view to reveal various features of the object so as to help one to use a map view easily. The objects may be displayed as labels and the same type of objects can be grouped together as a stack.

Screen 21 on which, by clicking on a highlight button 46, various features may appear to help a user to use a map view 53 easily, for instance, by highlighting a target type of object, searching a target object, showing certain objects, hiding certain objects, selecting objects, and so on. Object types may be differentiated by their shapes and colors. A user may click on an object, such as a "VAV W/RH" 47, to get a clearer view.

Such click may result in a dialog box 48 which permits the object 47 or objects to be expanded as indicated by the mouse cursor 41 being clicked on label 49 entitled "Expand Group". Other items which may be clicked on in box 48 relative to a selected object may involve "Assign to Network Channel", "Collapse Group", "Wiring type", "New" and "Properties".

In the map view 53, a user may create a new object 51 and assign it to a target area 55 of, for example, level 1. A user may drag-and-drop a target object 51 from a library palette 54 to the target area 55. Otherwise, the user may select the target area, such as area 55 as an instance, and then command to create a target object through a context menu.

Each of the objects or devices may have a database associated which includes information like points, part number, standard control program, schematics, operator screen graphics, and so forth. This information may help to automatically generate many kinds of reports for a control solution.

Figure 10:
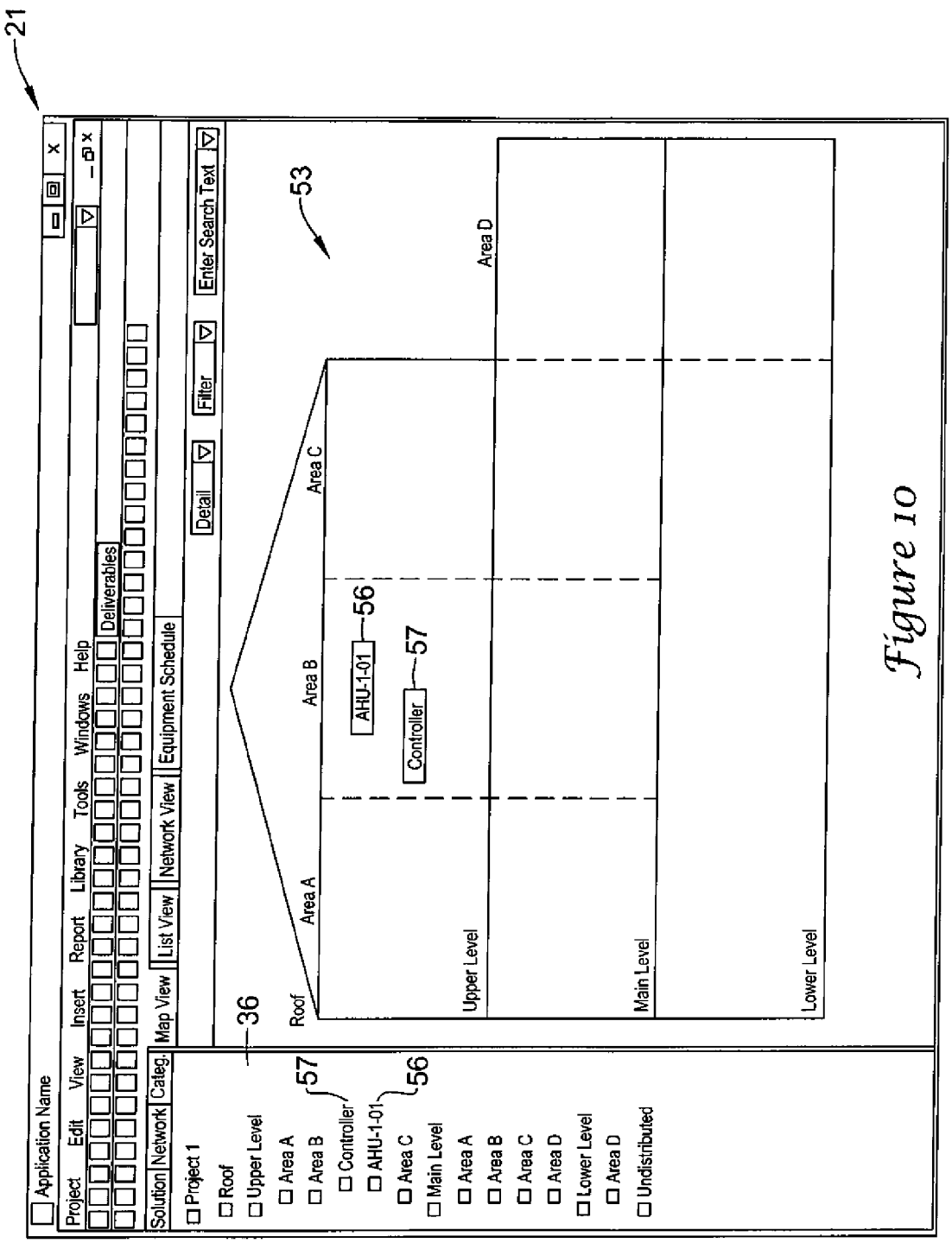
FIG. 10 is a diagram of a screen where there may be a defining object associations to a map view, for example, assigning a plant to a controller.

In FIG. 10, a user may define object associations to the map view; for example, assign a plant 56 to a controller 57. Palette 36 of the tree listing shows the association of controller 57 with plant "AHU-1-01" 56 in an area B of the upper level in map view 53.

Figure 11:
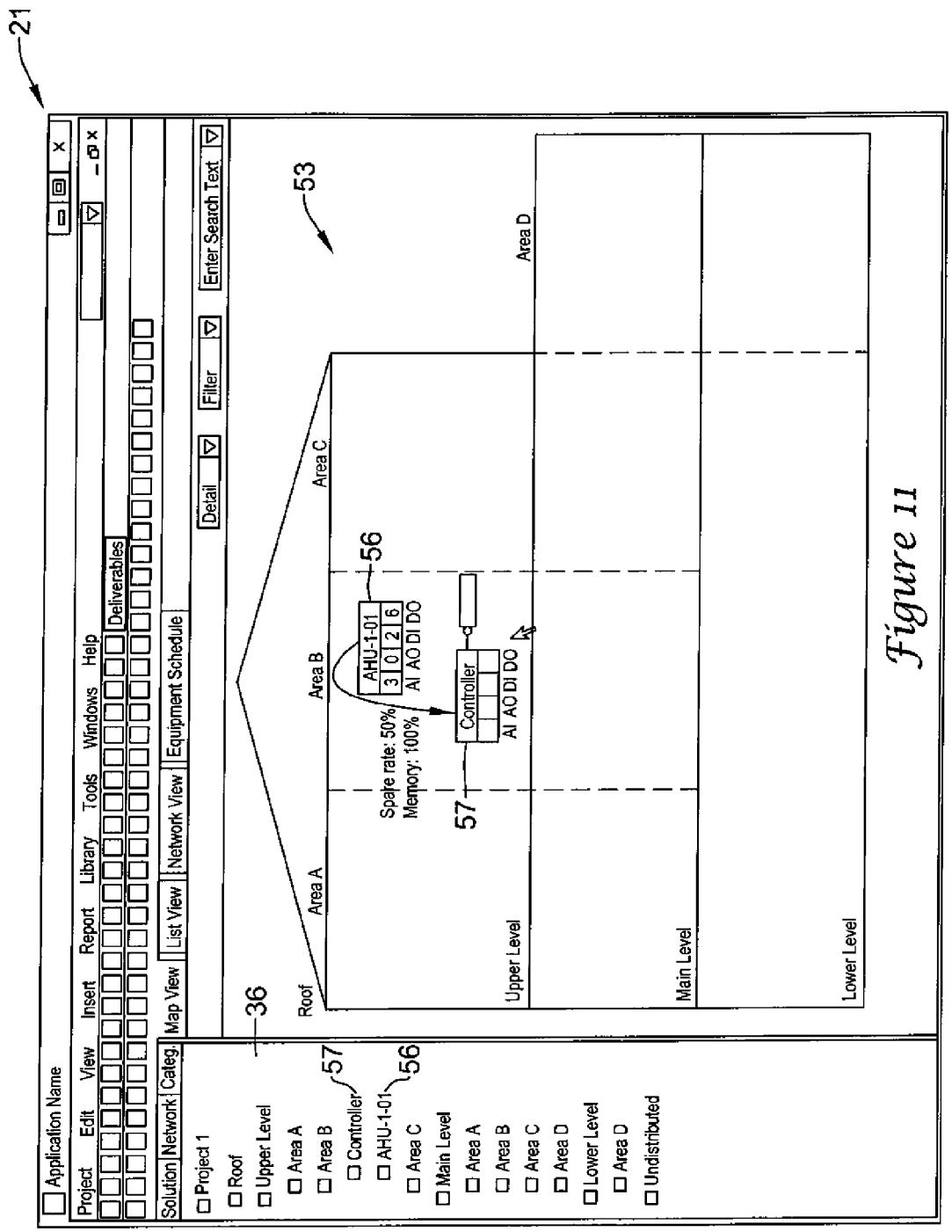
FIG. 11 is a diagram of a screen where assigning a plant to a controller may result in some contextual information about one or more of the items.

As indicated in FIG. 11, when assigning a plant to a controller, the system may provide the user some contextual information such as a point of connection, memory status, communication status, and so forth. An example of contextual information is shown proximate to plant 56 and controller 57.

Figure 12:
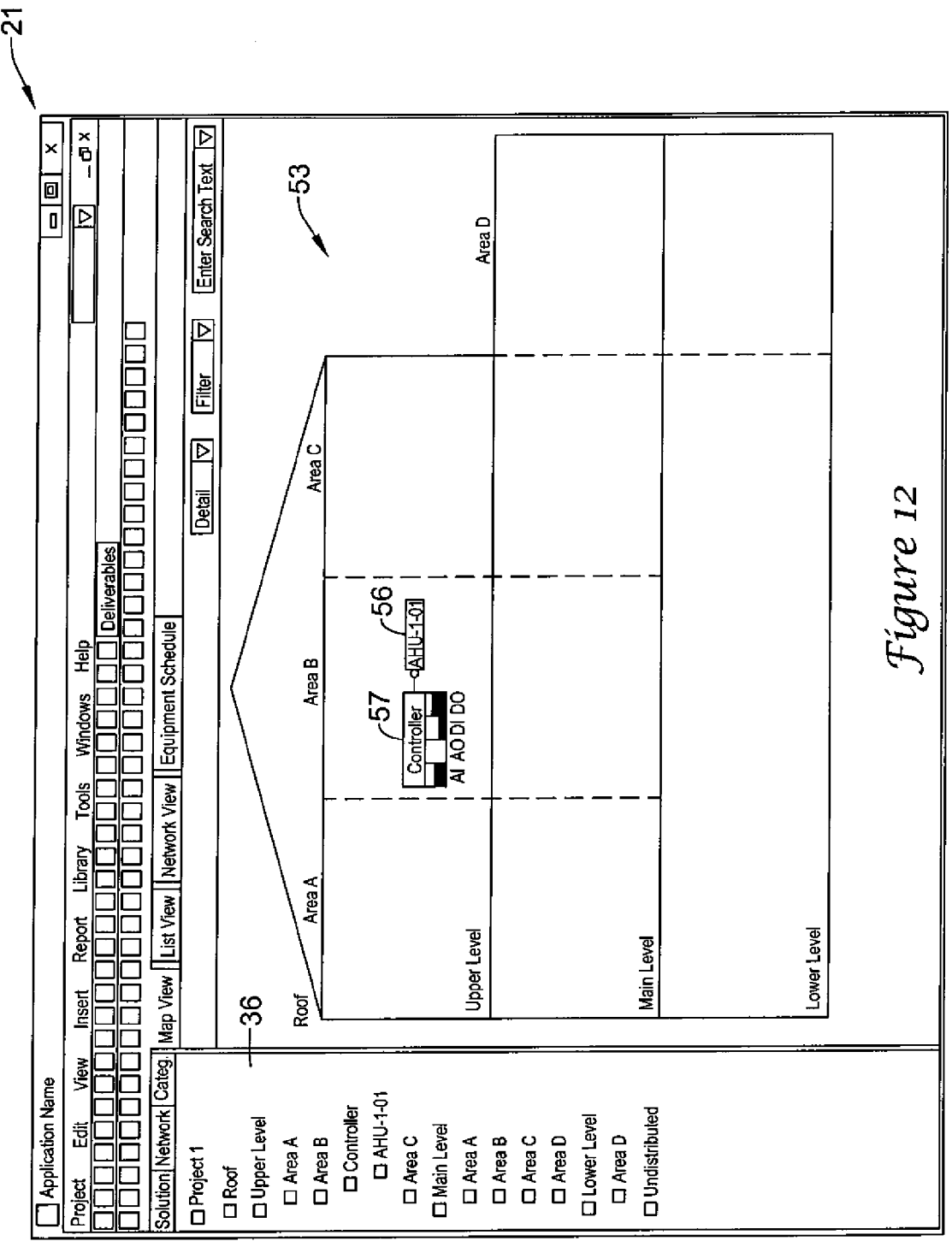
FIG. 12 is a diagram indicating that once an association is defined, such as that between a controller and a plant, the association may be reflected on the map view.

FIG. 12 indicates that once an association is defined, such as that between controller 57 and plant 56, it may be reflected on the map view 53 as well. For example, there may be a live connection metaphor, a container metaphor, or some other representation of the association.

Figure 13:
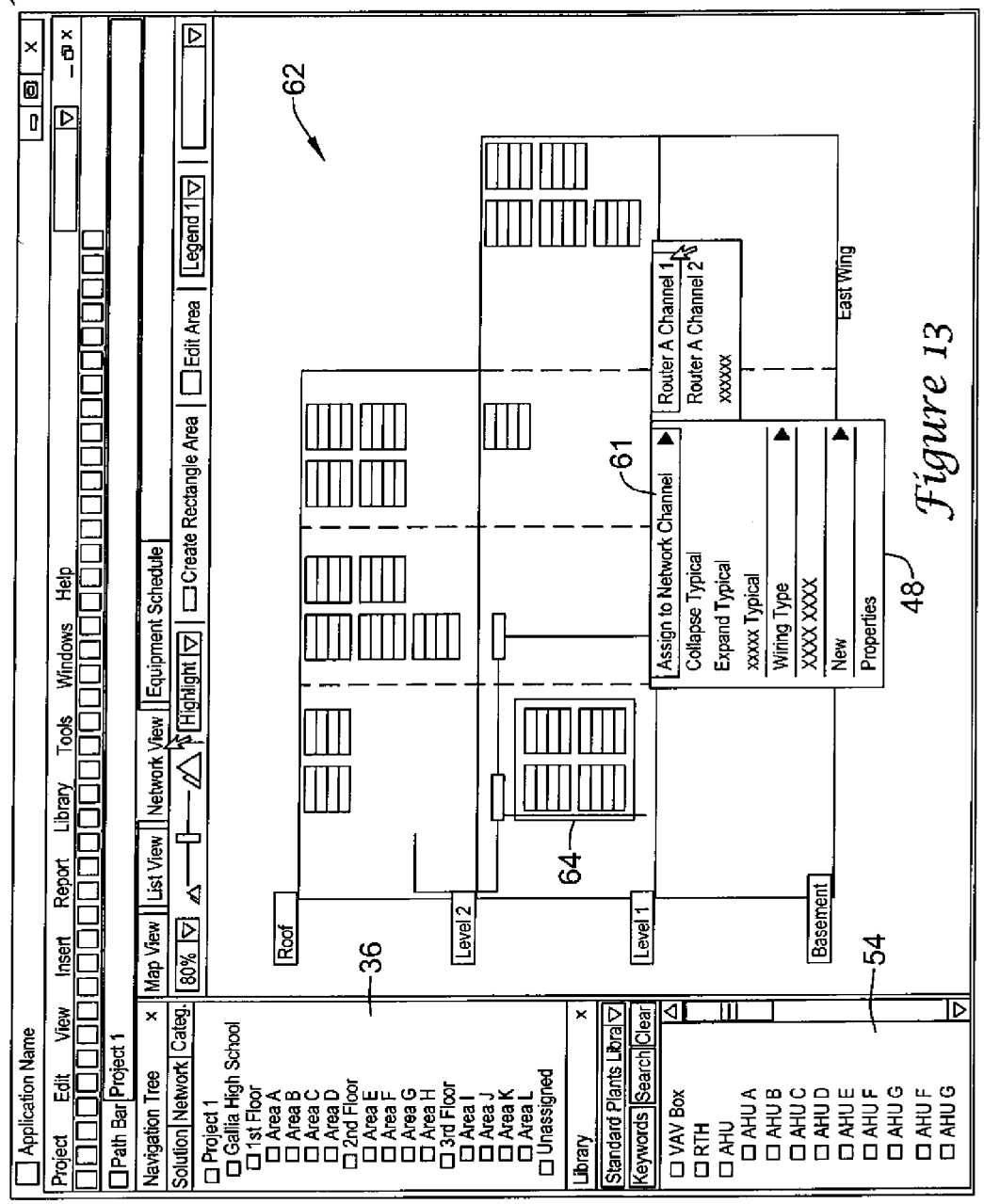
FIG. 13 is a diagram showing an assignment of devices to a controller and controllers to a network.

Another example of association, in a network view 62 of FIG. 13, a user may assign devices to a controller or assign controllers to a network. Network view 62 in FIG. 13 is another version of map view 53 in preceding Figures. A dialog box 48 may appear relative to, for instance, a controller, which has a label 61 "Assign to Network Channel" which might be extended to show a choice of channels. The choice in FIG. 13 may consist of router A channel 1 and router A channel 2. There may be other channels to choose from if a user so desires.

Figure 14:
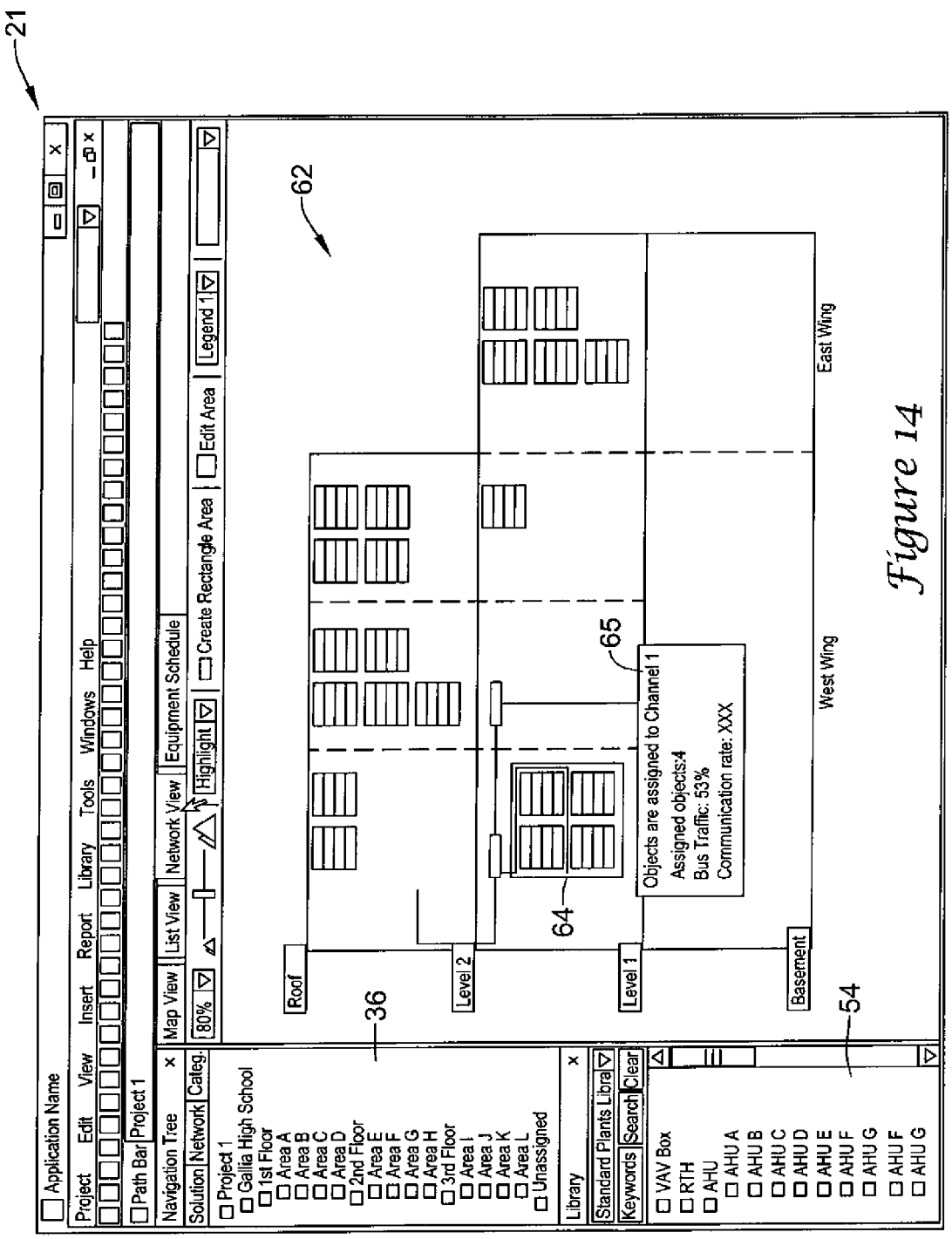
FIG. 14 is a diagram showing objects which may be assigned to a certain channel where a connection line from the objects to the network channel may be auto-generated.

FIG. 14 is a diagram showing objects 64 which may be assigned to channel 1 of router A. The connection line from the objects 64 to the network channel may be auto-generated based on a defined assignment or association. The system may provide contextual information 65 to facilitate the assignment or association. Information 65 may indicate the assigned objects, bus traffic, a communication rate, and additional items as needed.

Figure 15:
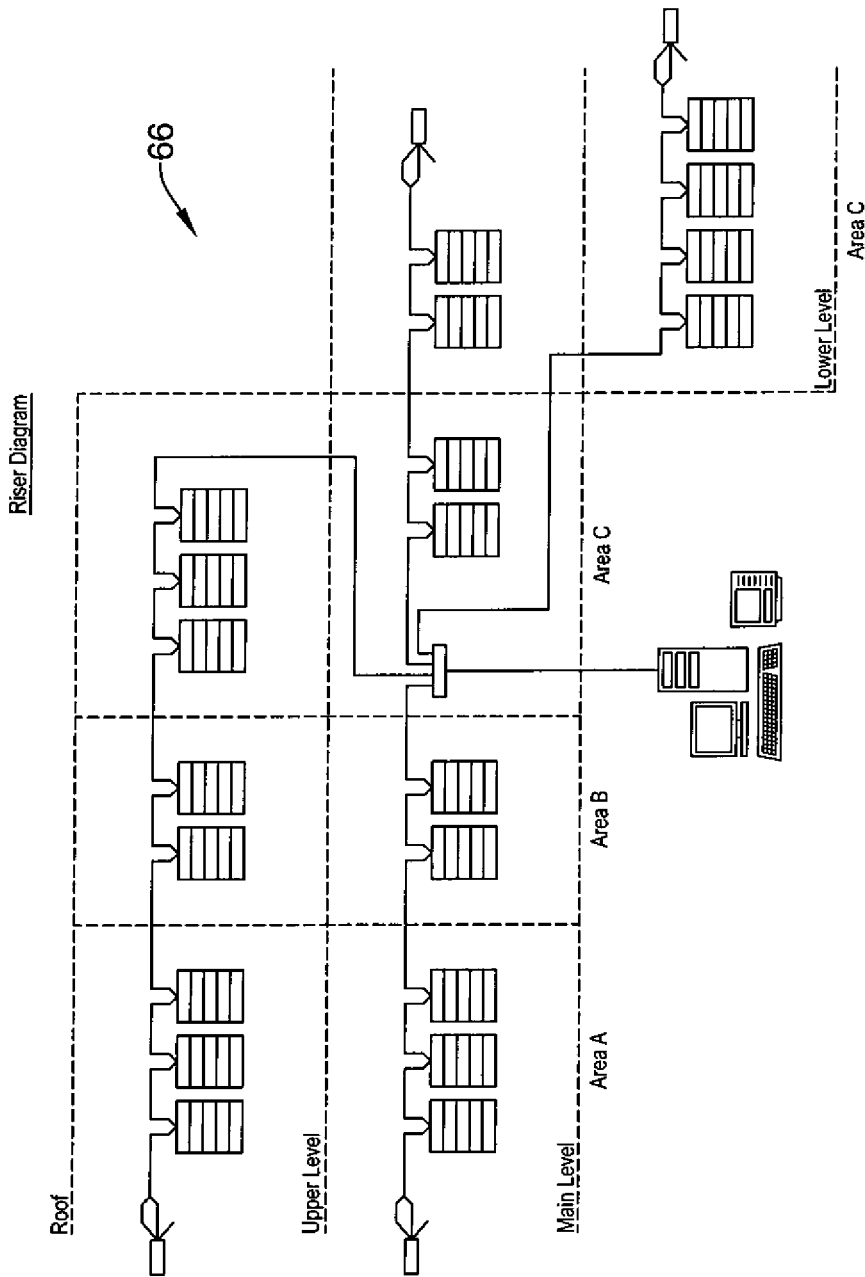
FIG. 15 is a diagram showing that by operating a map view, a riser diagram for a building or facility can be generated according to a predefined format.
Figure 16:
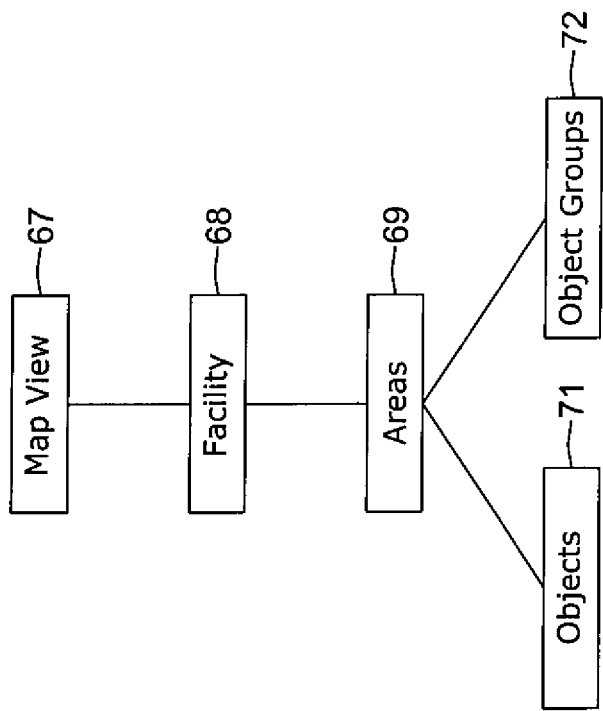
FIG. 16 is a high level diagram of a general data model of a map view.

FIG. 15 reveals a riser diagram 66 of the facility. A riser diagram may reveal components, such as devices and controllers, connection lines, and so forth in the areas of the floors. Diagram 66 may be automatically generated by the system. Various reports, such as diagram 66, drawings and a control program may automatically be generated by the system. The diagram shows that by operating a map view, a riser diagram for a building or facility can be generated automatically according to a predefined format;

FIG. 16 is a high level diagram of a general data model of a map view. A map view 67 may be presented in different ways. Examples of ways may consist of a network map or view, a riser view, a 3D perspective view, and so on. Following map view 67 is a facility 68. Facility 68 may be a stadium, a building, or several buildings. Areas 69 may follow facility 68. An area 69 may be multiple floors, one floor, several rooms or one room. One area may contain other areas.

Objects 71 and object groups 72 may follow areas 69. Objects 71 may vary much for different building systems. For example, objects may be controllers, panels, plants, devices, and so on. For each object, its related data may be associated in the backend, such as a product number, data points, control programs, and so on.

Figure 17:
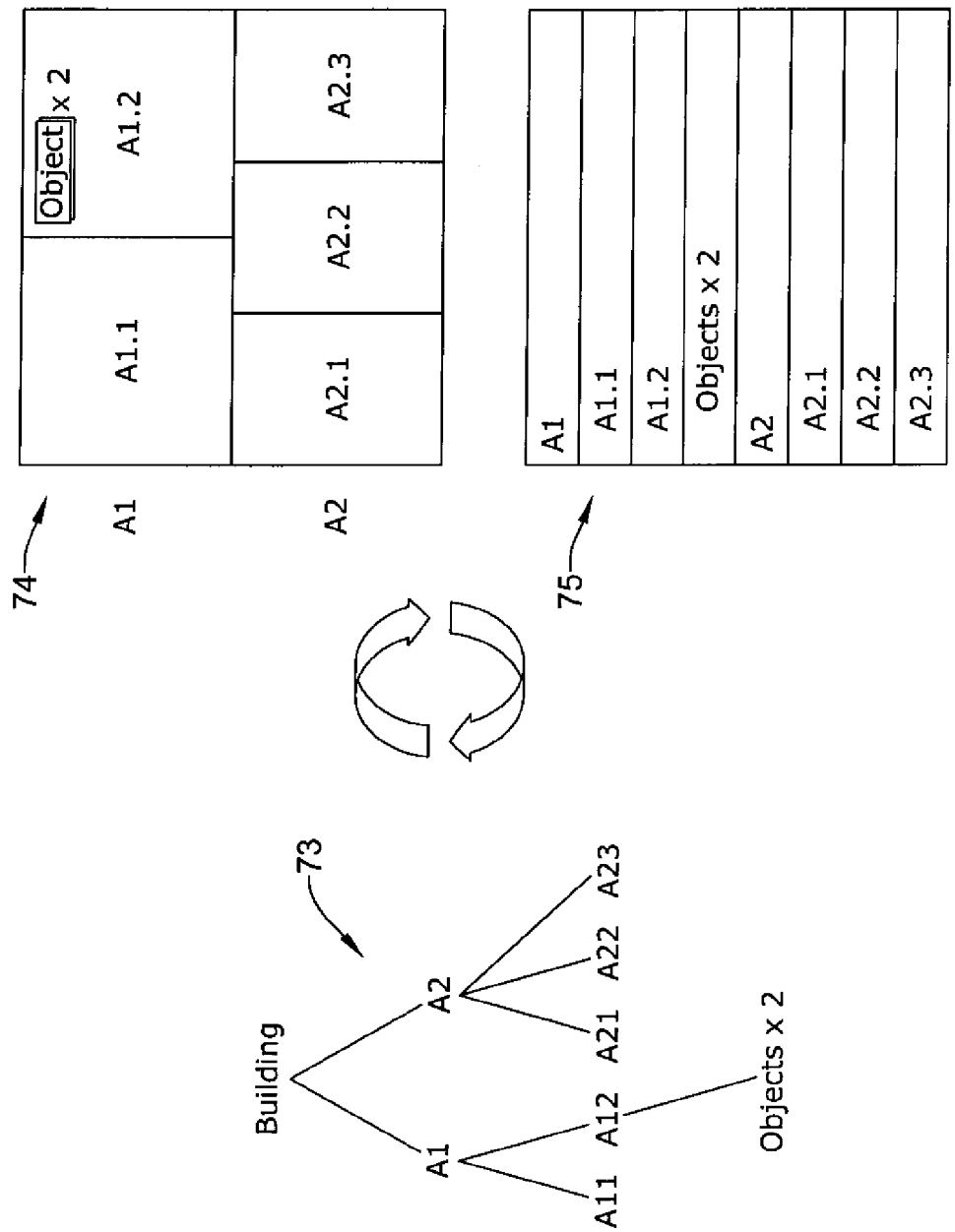
FIG. 17 shows a tree view, a facility model (map view) and a list view where data may be displayed and synchronized among views.

FIG. 17 shows a tree view 73, a facility model 74 and a list view 75. Facility model 74 may be like or regarded as a tree view. There may be an automatic generation and synchronization among and between tree view 73, map view 74 and list view 75. FIG. 17 is an example of how data are displayed and synchronized among views 73, 74 and 75. Through the way presented, live data may be fed to map view 74 to show a dynamical presentation. Correlation of the nomenclature A1, A2, A11, A12, A21, A22, A23 and Objects×2 of view 73 may be noted relative to A1, A2, A1.1, A1.2, A2.1, A2.2, A2.3 and Objects×2 of views 74 and 75.

Figure 18:
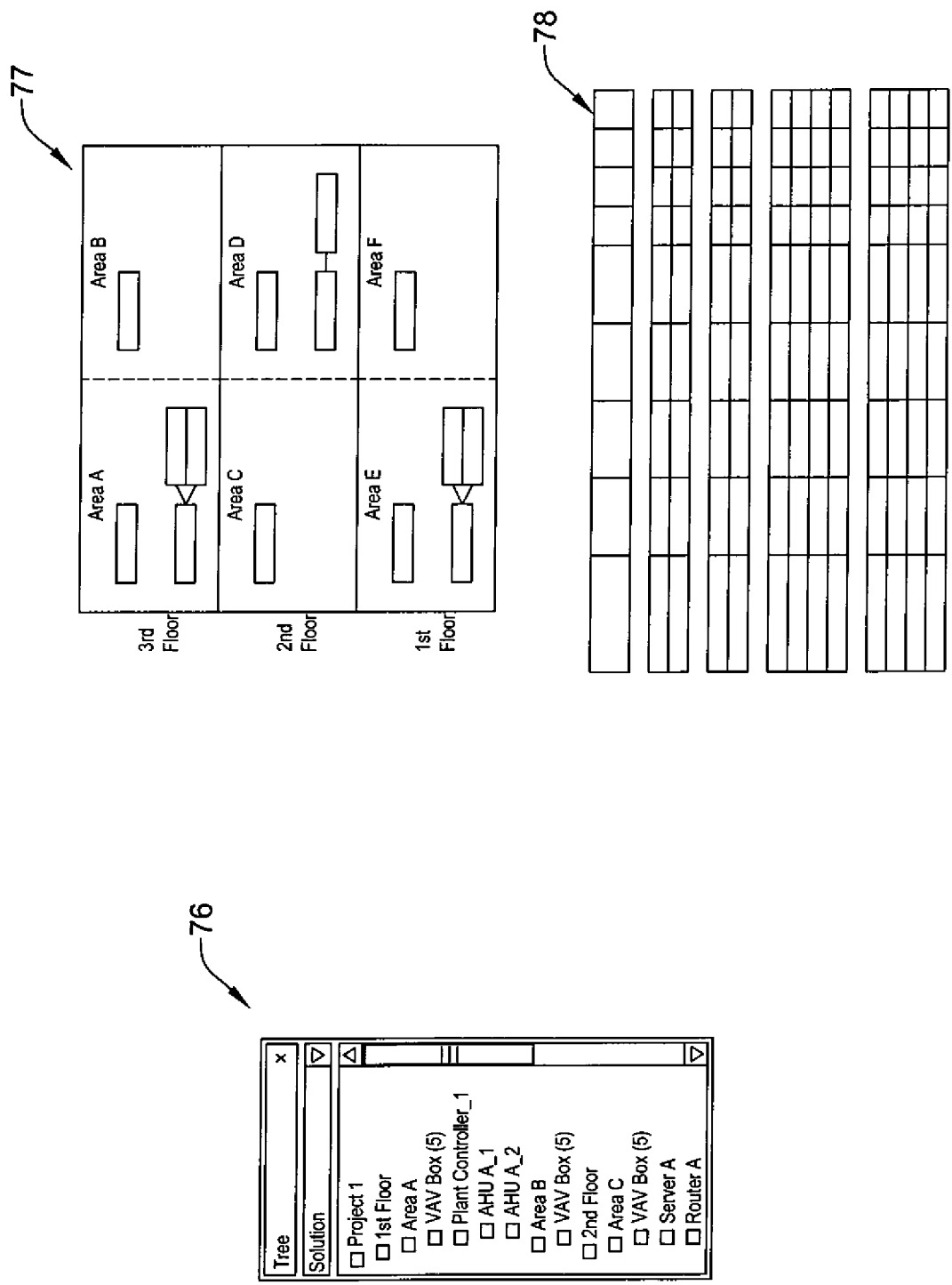
FIG. 18 is a diagram showing a concrete presentation of a building or facility model (map view), a list view and a tree view.

FIG. 18 illustrates examples of three types of views—a traditional tree view example 76, a map view example 77 and a list view example 78. View 77 may be a graphical view of a tree structure, a riser be or be like an abstract facility model, and be a complex building simply reduced into cross-sections which are rectangular. View 78, as a list view, may be or be like an Excel spreadsheet integrated with a hierarchical structure.

Figure 19:
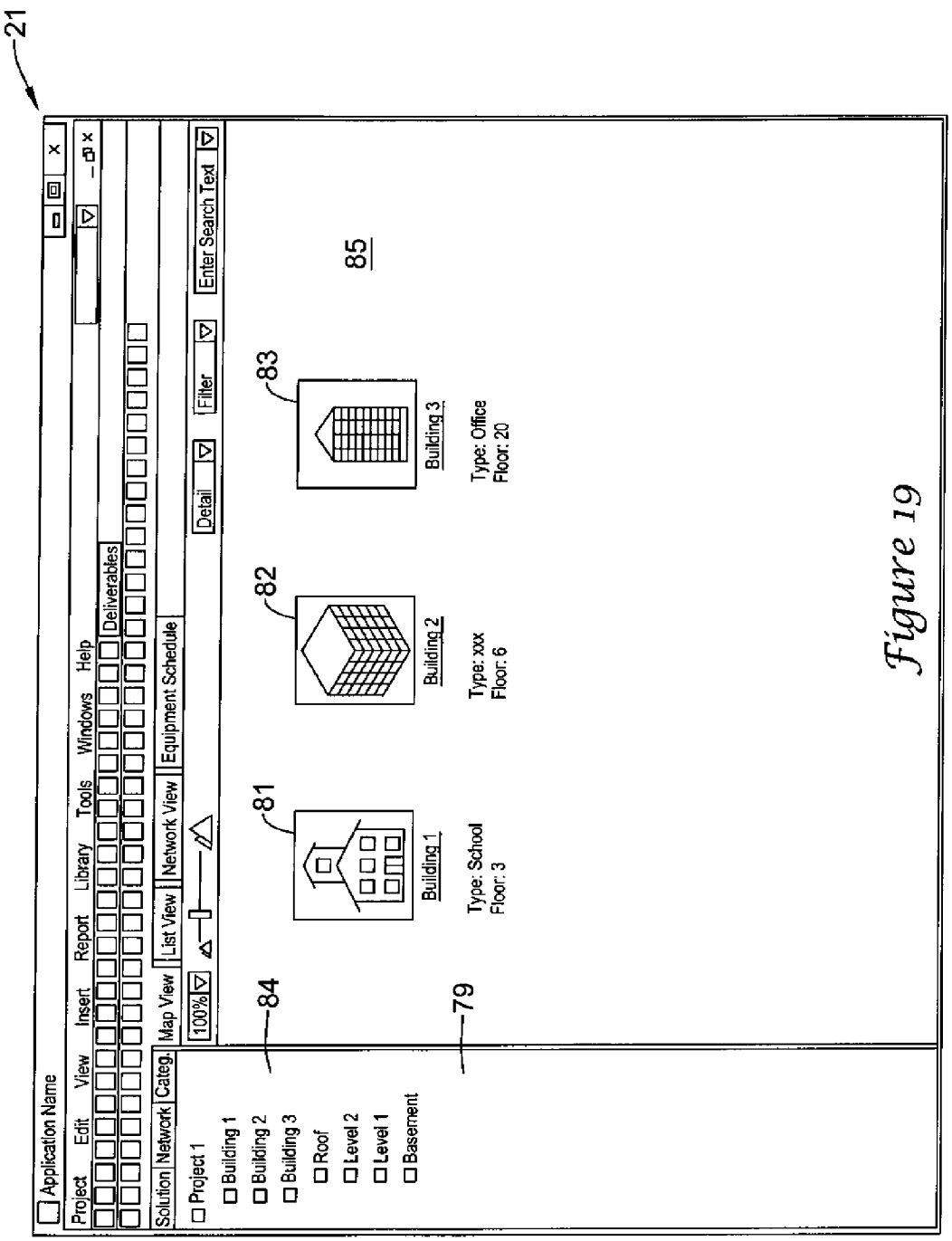
FIG. 19 is a diagram illustrating a facility that has multiple buildings.

FIG. 19 is a screen 21 which illustrates where one facility may have multiple buildings. There may be a tree 79 in palette 84 representing a project of facility 79 having three buildings 81, 82 and 83. In a map view 85, building 81 may be a school having three floors, building 82 may be a structure having six floors and building 83 may be an office building having twenty floors.

Figure 20:
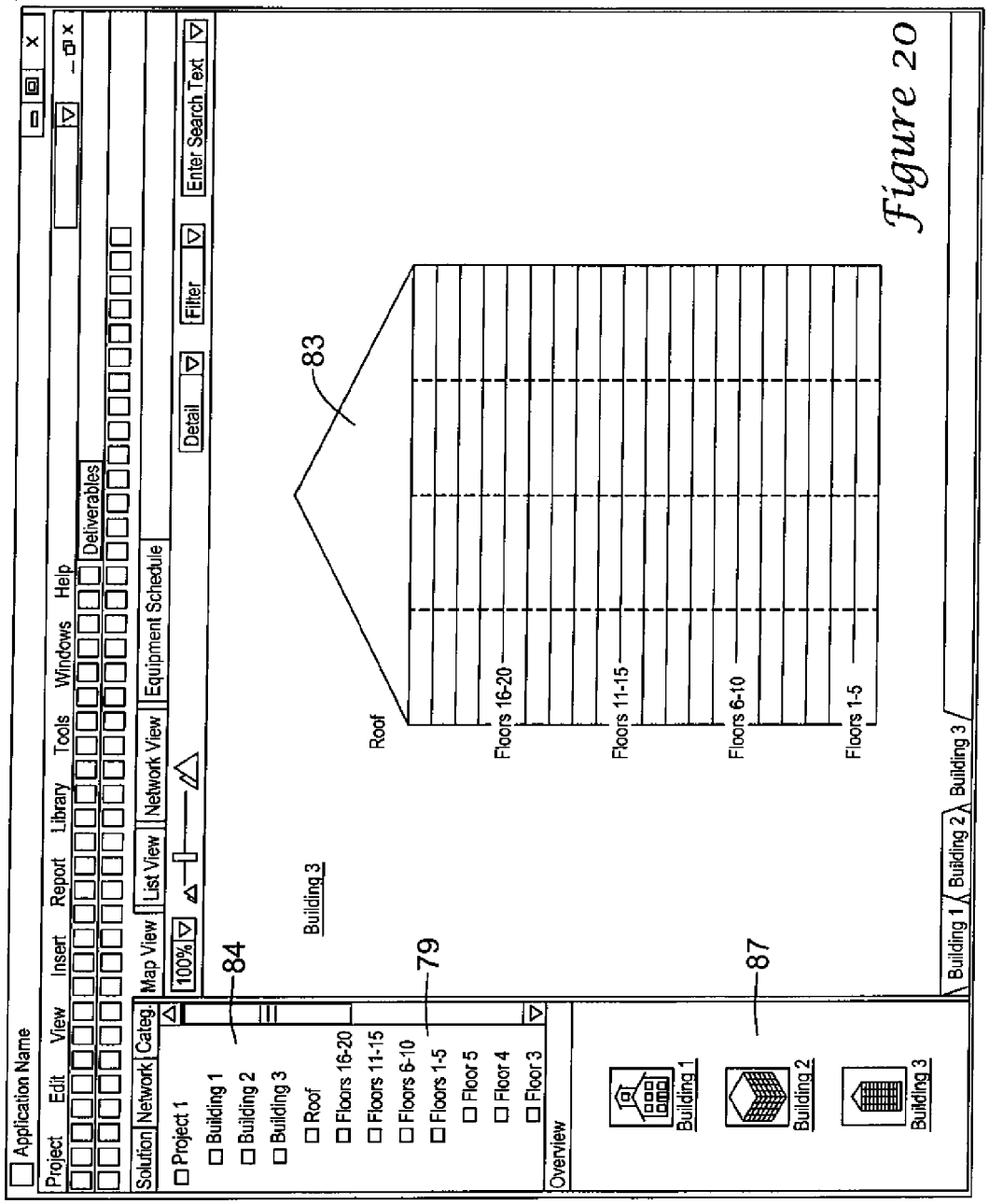
FIG. 20 is a diagram of a screen 21 showing a side map view of a building and revealing objects in it.

FIG. 20 is a screen 21 showing a side map view 86 of building 83. A user may command to display one of the buildings 81, 82 and 83, as in the present example. Devices in the displayed building may be grouped and color coded according to their type. Objects inside a location of the building may be automatically arranged to provide a clear view. Palette 87 indicates an overview of the facility and the building selected for display.

Figure 21:
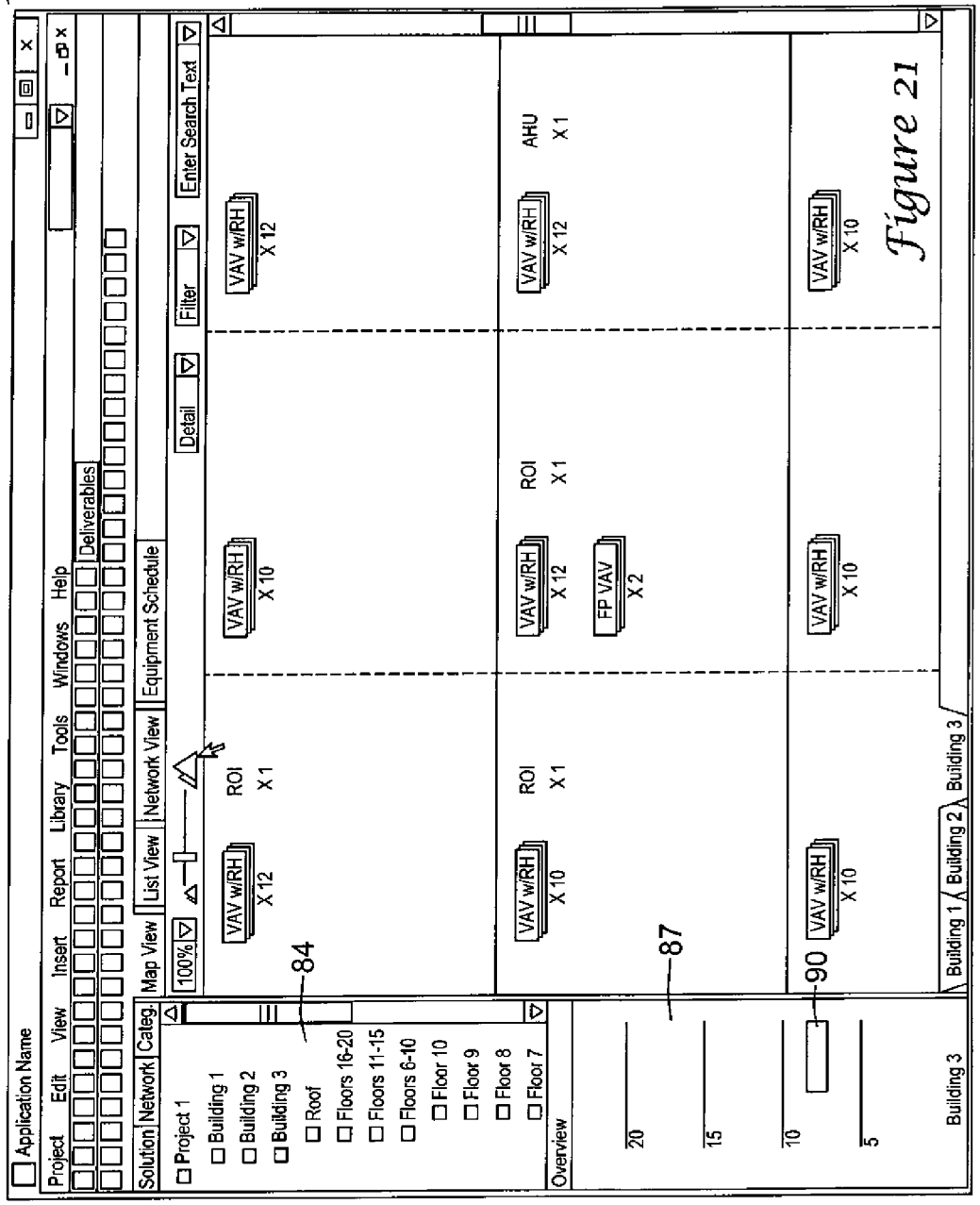
FIG. 21 is a diagram showing a map view of a building which may be navigated by a zoom and pan operation or by scroll bars, or by clicking on a target facility tree mode.

FIG. 21 shows screen 21 showing detailed information of displayed building 83. For the high rise building 83, a user may navigate to the target by a zoom and pan operation, or by scroll bars. Or instead, the user may navigate to the target by clicking on the facility tree mode. When zooming in a view of the target or a portion of it, more detailed information may be displayed. Floors between the fifth and eleventh are displayed in screen 21. The overview palette 87 portion of screen 21 may indicate a location 90 of the detailed portion of map view 86.

Figure 22:
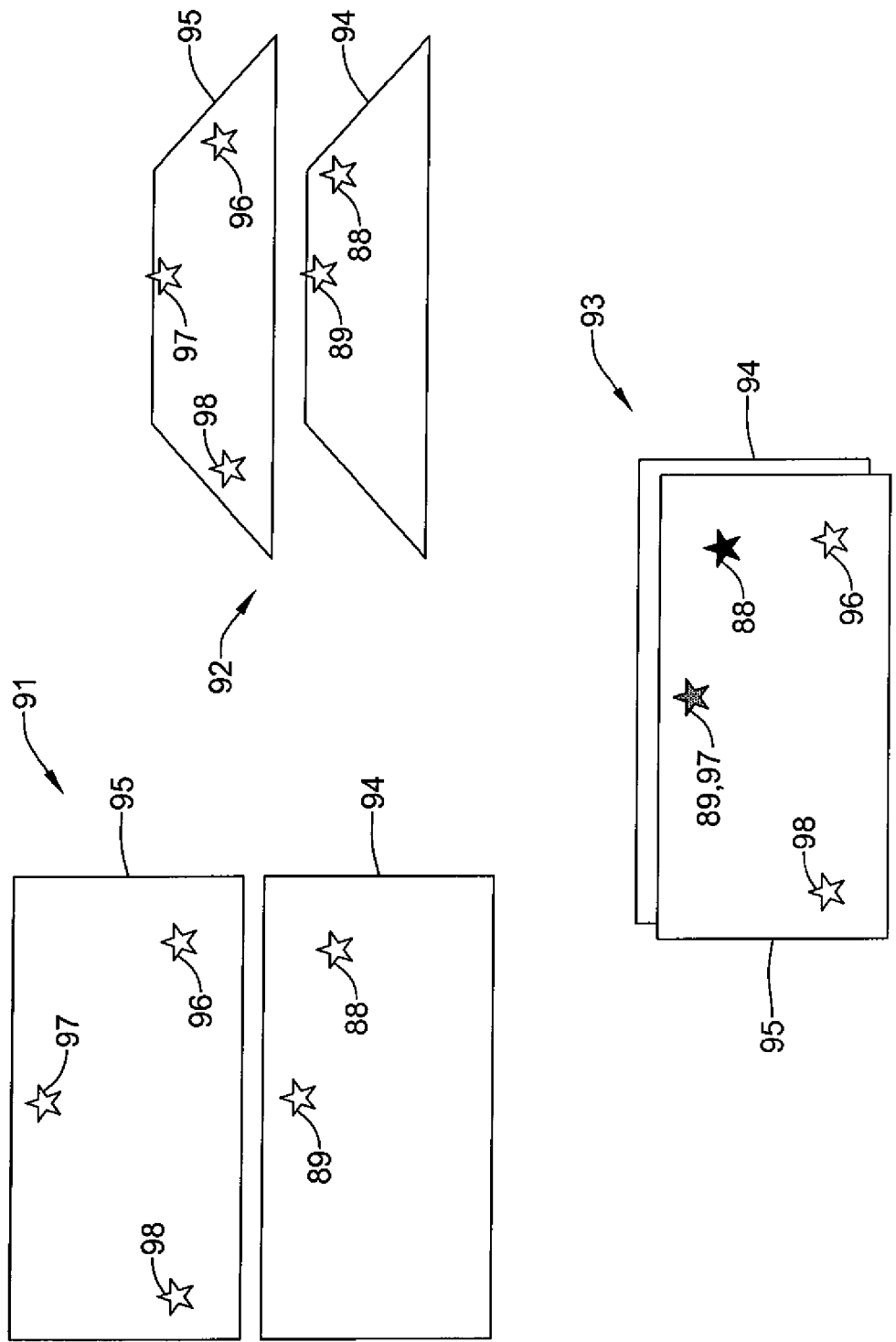
FIG. 22 is a diagram of various illustrative example presentations, although other kinds of presentations may be used, for facilitating design and analysis of a building structure.

FIG. 22 is a diagram of advanced presentations of a map view to facilitate design and analysis of a structure. Presentation 91 may be regarded as a flat (default) map view of, for example, first and second floors 94 and 95, respectively, of a building. The first floor 94 may have objects 88 and 89. The second floor 95 may have objects 96, 97 and 98. Presentation 92 may be regarded as a perspective map view of the first and second floors 94 and 95 with objects 88, 89, 96, 97 and 98. The perspective presentation 92 may help to provide more vertical information about the floors and their respective objects. The perspective presentation of the floors may be at an angular view along an optical axis having an angle not parallel or vertical relative to a major surface of the respective floors. Presentation 93 may be regarded as an overlay map view. Such presentation may help a user with some complex analysis and design relative to the floors and their objects. The overlapping plan views show the objects of each floor with a graphic feature (e.g., color, shading, or shape) identifying the objects of each floor and objects of two or more floors having a vertical overlap. Floor 95 appears overlaid on floor 94. The objects of both floors are shown. Object 89 of floor 94 appears to be overlaid by object 97 of floor 95. An example of overlaid objects may be sinks. One reason for sinks to overlay each other may be the sinks can easily share common plumbing, i.e., water lines and drainage pipes.

Figure 23B:
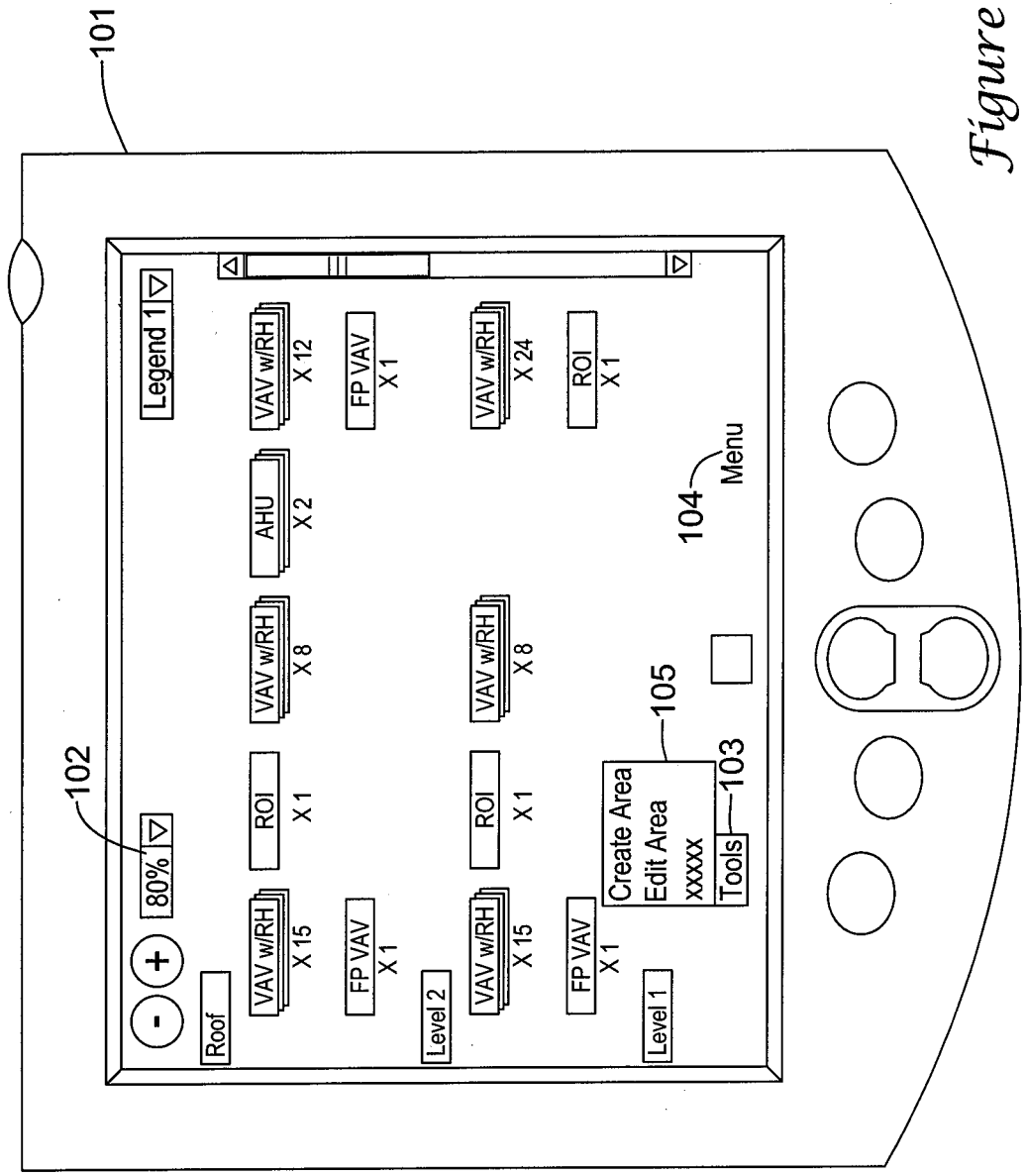

FIGS. 23*a* and 23*b* are diagrams showing an application of the present approach to mobile devices, e.g., a PDA. PDA 101 of FIG. 23*a* may have an example map view similar to map view 53 of FIG. 9. PDA 101 of FIG. 23*b* may show an example map view of the PDA of FIG. 23*a* being zoomed in from 20% to 80% as noted by an indicator 102. These map views show illustrative example uses of PDA's. Map views may also be used in smart phones. Other mobile devices may be utilized for map views and design activities associated with them. In small screen mobile devices, a map view may show the relationship between areas and objects in an intuitive way. It should be much easier for a user to work on the map view, rather than on the tree-structure or CAD drawings. Tools 103, including a drop-down menu 105, and other menu 104 information may be available on mobile devices.

In the present specification, some of the matter may be of a hypothetical or prophetic nature although stated in another manner or tense.

Although the present system has been described with respect to at least one illustrative example, many variations and modifications will become apparent to those skilled in the art upon reading the specification. It is therefore the intention that the appended claims be interpreted as broadly as possible in view of the prior art to include all such variations and modifications.

What is claimed is:

1. A computer-implemented method for designing a building system, comprising:
    defining, using a computer, building information; and
    developing, using the computer, building information; and
    wherein:
        defining, using the computer, building information comprises:
            selecting a building from a category from a drop down menu on a display in communication with the computer;
            selecting a type of building from a dialog box; and
            selecting a building; and
        developing, using the computer, building information comprises:
            selecting a number of floors for the building from the dialog box;
            in the dialog box, a user giving a name to each of the floors;
            designating areas for each floor; and
    further comprising:
    representing the building and floors with a map view diagram shown on the display; and
    dragging and dropping geometrical shapes on the diagram to represent objects in the building and to reflect space relationships among the objects and wherein if the building is represented with a tree view and a list view, then the map view can be automatically generated and synchronized with the tree view and list view.

2. The method of claim 1, further comprising using an insert table metaphor in the display to select the number of floors and a number of areas by dragging a cell in the insert table.

3. The method of claim 1, wherein:
    the space relationships indicate the objects as distinguished from each other in the building; and
    the objects are components, devices and controllers which can be placed, moved around, connected, and associated with each other.

4. The method of claim 1, further comprising:
    adjusting the shape, size, position and location of each area, as needed, on each floor; and
    inserting, merging, splitting and/or deleting areas as needed.

5. The method of claim 4, further comprising adjusting areas on various floors and their space relationship relative to areas on other floors so that the floors of the building are congruent, or otherwise, as desired, relative to each other.

6. The method of claim 1, further comprising:
    dragging and dropping geometrical shapes, representing one or more new objects, on an area of a floor in the diagram of the building; and
    adjusting as needed a location of each new object after its representative shape has been dropped in an area.

7. The method of claim 6, further comprising differentiating types of objects with graphical features on the geometrical shapes.

8. The method of claim 7, further comprising:
    expanding or collapsing a group of objects as necessary to obtain a clearer view of the objects in the display;
    selecting or deselecting a type of objects; and
    showing or hiding a type of objects.

9. The method of claim 7, further comprising:
    providing a database for information of each object;
    defining associations of objects as represented in the map view diagram on the display; and
    wherein:
        an association of an object with another object can provide contextual information from the database of the one or more objects; and
        contextual information comprises connection, memory status and communication status.

10. The method of claim 9, wherein:
    a connection among objects is auto-generated based on a defined association; and
    the contextual information is provided for facilitating the defined association.

11. The method of claim 6, wherein:
    a riser diagram showing the objects and their connections is automatically generated; and
    reports, drawings and a control program of the building are automatically generated.

12. A display view, displayed on a display in communication with a computer configured to execute instructions, for a building system comprising:
    a map view of a building displayed on the display;
    a tree view of the building displayed on the display; and
    a list view of the building displayed on the display; and
    wherein a computer executes instructions stored on a non-transitory computer readable medium to:
        synchronize live data of all three views; and feed said synchronized live data to the map view to show a dynamical presentation.

13. The display view of claim 12, wherein:
    the tree view comprises different tree structures;
    the map view is a tree map having a graphical view of a tree structure, riser-like abstract building model, and a building reduced into cross sections; and
    the list view is a spreadsheet integrated with a hierarchical structure.

14. The display view of claim 12, wherein:
one or more buildings are displayed;
a building has one or more locations in it;
the one or more locations have objects which can be automatically arranged as necessary for a clearer view of the objects; and
objects are grouped and graphically coded according to type.

15. The display view of claim 14, wherein:
the one or more buildings, including locations and areas, can be navigated about on a display;
a user can navigate to a destination in the building on the display by a zoom and pan operation or by clicking on the destination; and
upon arriving at the destination, information about the destination is shown on the display.

16. A system for design and presentation, using a computer, of a building having two or more floors, comprising a design of the building presented with a tree view and a list view; wherein a map view of the building can be automatically generated and synchronized with the tree view and the list view:
a flat presentation of a building on a display in communication with a computer;
and
wherein the computer executes instructions stored on a non-transitory computer readable medium to show on the display of the flat presentation of a building:
a plan view for each floor of a design of a building; and
objects of the respective floors in the respective plan views of the design of the building.

17. The system of claim 16, further comprising:
a perspective presentation of the design of the building on the display; and
wherein the computer executes instructions stored on a non-transitory computer readable medium to show on the display of the perspective presentation of the design of the building:
an angular view of the floors along an optical axis having an angle not parallel or vertical relative to a major surface of the respective floors; and
objects of the respective floors in a spatial relationship to each other.

18. The system of claim 17, further comprising:
an overlay presentation of the design of the building on the display; and
wherein the computer executes instructions stored on a non-transitory computer readable medium to shown the display of the overlay presentation of the design of the building:
overlapping plan views of the floors; and
objects of each floor with a graphic feature identifying the objects of each floor and objects of two or more floors having a vertical overlap.

19. The system of claim 18, wherein the flat presentation, the perspective presentation and the overlay presentation are used for viewing and designing the building and floors, and for placement of objects in the building.

20. The system of claim 18, wherein:
the views, presentations and diagrams of the building or portions of the design of the building can be displayed on a screen of a small screen device;
zoom and navigation features of the small screen device can be applied to the views, presentations and diagrams; and
the small screen device can be a hand-held, mobile, or permanently situated device.

21. A computer-implemented method for designing a building system, comprising:
defining, using a computer, building information; and
developing, using the computer, building information; and
wherein:
defining, using the computer, building information comprises:
selecting a building from a category from a drop down menu on a display;
selecting a type of building from a dialog box; and
selecting a building; and
developing, using the computer, building information comprises:
selecting a number of floors for the building from the the dialog box;
naming the floors;
designating areas for each floor; and
further comprising:
representing the building and floors with a map view diagram shown on the display; and
dragging and dropping geometrical shapes on the diagram to represent objects in the building and to reflect space relationships among the objects; and
wherein if a building model and objects are generated from a list view or a tree view, then a map view of the building model and objects can be generated and synchronized with the tree view or list view.

* * * * *